United States Patent
Harris et al.

(10) Patent No.: US 6,623,609 B2
(45) Date of Patent: Sep. 23, 2003

(54) LIFT AND ROTATE ASSEMBLY FOR USE IN A WORKPIECE PROCESSING STATION AND A METHOD OF ATTACHING THE SAME

(75) Inventors: Randy Harris, Kalispell, MT (US); Daniel J. Woodruff, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 15 days.

(21) Appl. No.: 09/875,424

(22) Filed: Jun. 5, 2001

(65) Prior Publication Data

US 2001/0023821 A1 Sep. 27, 2001

Related U.S. Application Data

(60) Continuation-in-part of application No. 09/604,198, filed on Jun. 27, 2000, now Pat. No. 6,342,137, which is a division of application No. 09/351,980, filed on Jul. 12, 1999, now Pat. No. 6,168,695.

(51) Int. Cl.[7] .................. C25D 17/06; B05C 13/00
(52) U.S. Cl. ................... 204/297.08; 118/500
(58) Field of Search .............. 204/297.06, 297.07, 204/297.08, 297.01; 118/500

(56) References Cited

U.S. PATENT DOCUMENTS

| | | | |
|---|---|---|---|
| 1,526,644 A | 2/1925 | Phinney | 205/118 |
| 1,881,713 A | 10/1932 | Laukel | 204/288 |
| 2,256,274 A | 9/1941 | Boedecker et al. | 260/397.7 |
| 4,046,105 A | 9/1977 | Gomez | 118/429 |
| 4,304,641 A | 12/1981 | Grandia et al. | 204/23 |
| 4,495,453 A | 1/1985 | Inaba et al. | 318/568 |
| 4,566,847 A | 1/1986 | Maeda et al. | 414/744 R |
| 4,634,503 A | 1/1987 | Nogavich | 204/27 |
| 4,648,944 A | 3/1987 | George et al. | 204/1 T |
| 4,761,214 A | 8/1988 | Hinman | 204/224 M |
| 4,828,654 A | 5/1989 | Reed | 204/23 |
| 4,902,398 A | 2/1990 | Homstad | 204/298 |
| 4,949,671 A | 8/1990 | Davis et al. | 118/725 |
| 4,988,533 A | 1/1991 | Freeman et al. | 427/38 |
| 5,000,827 A | 3/1991 | Schuster et al. | 204/15 |
| 5,061,144 A | 10/1991 | Akimoto et al. | 414/225 |
| 5,135,636 A | 8/1992 | Yee et al. | 205/96 |
| 5,138,973 A | 8/1992 | Davis et al. | 118/723 |

(List continued on next page.)

FOREIGN PATENT DOCUMENTS

| | | |
|---|---|---|
| WO | WO 00/02808 | 1/2000 |
| WO | WO 00/61498 | 10/2000 |
| WO | WO 00/61837 | 10/2000 |
| WO | WO 01/90434 | 11/2001 |
| WO | WO 02/097165 | 12/2002 |
| WO | WO 02/099165 | 12/2002 |

OTHER PUBLICATIONS

Lee, Tien–Yu Tom, et al., "Application of a CFD Tool in Designing a Fountain Plating Cell for Uniform Bump Plating of Semiconductor Wafer," IEEE Transactions on Components, Packaging and Manufacturing Technology, Part B, Feb. 1996, pp. 131–137, vol. 19, No. 1, IEEE.

(List continued on next page.)

Primary Examiner—Patrick Ryan
Assistant Examiner—Thomas H. Parsons
(74) Attorney, Agent, or Firm—Perkins Coie LLP

(57) ABSTRACT

A lift and rotate assembly for use in a workpiece processing station. The lift and rotate assembly includes a body having a slim profile and pins located on opposite sides for mounting the assembly onto a tool frame. The lift and rotate assembly is removably and pivotally mounted to an exposed outer surface of the frame. The lift and rotate assembly has a body, a process head movably connected to the body, and control components mounted within the body and configured to move the process head relative to the body. The lift and rotate assembly in one embodiment is positionable in a forward, operating position with the body adjacent to the frame, and in a tilted, service position with the body tilted away from the frame.

42 Claims, 19 Drawing Sheets

U.S. PATENT DOCUMENTS

| | | | |
|---|---|---|---|
| 5,156,174 A | 10/1992 | Thompson et al. | 134/153 |
| 5,217,586 A | 6/1993 | Datta et al. | 204/129.6 |
| 5,222,310 A | 6/1993 | Thompson et al. | 34/202 |
| 5,227,041 A | 7/1993 | Brogden et al. | 204/297 R |
| 5,256,274 A | 10/1993 | Poris | 205/123 |
| 5,344,491 A | 9/1994 | Katou | 118/695 |
| 5,368,711 A | 11/1994 | Poris | 204/193 |
| 5,376,176 A | 12/1994 | Kuriyama | 118/313 |
| 5,377,708 A | 1/1995 | Bergman et al. | 134/105 |
| 5,571,325 A | 11/1996 | Ueyama et al. | 118/320 |
| 5,670,034 A | 9/1997 | Lowery | 205/143 |
| 5,681,392 A | 10/1997 | Swain | 118/407 |
| 5,684,713 A | 11/1997 | Asada et al. | 364/512 |
| 5,700,127 A | 12/1997 | Harada et al. | 414/416 |
| 5,723,028 A | 3/1998 | Poris | 204/231 |
| 5,754,842 A | 5/1998 | Minagawa | 395/604 |
| 5,762,751 A | 6/1998 | Bleck et al. | 156/345 |
| 5,765,444 A | 6/1998 | Bacchi et al. | 74/49.03 |
| 5,785,826 A | 7/1998 | Greenspan | 204/212 |
| 5,980,706 A * | 11/1999 | Bleck et al. | 204/297 R |
| 5,985,126 A | 11/1999 | Bleck et al. | 205/123 |
| 5,989,397 A | 11/1999 | Laube et al. | 204/298.03 |
| 5,999,886 A | 12/1999 | Martin et al. | 702/31 |
| 6,004,828 A | 12/1999 | Hanson | 438/7 |
| 6,027,631 A | 2/2000 | Broadbent | 205/137 |
| 6,028,986 A | 2/2000 | Song | 395/500.02 |
| 6,074,544 A | 6/2000 | Reid et al. | 205/157 |
| 6,090,260 A | 7/2000 | Inoue et al. | 205/102 |
| 6,091,498 A | 7/2000 | Hanson et al. | 356/375 |
| 6,110,346 A | 8/2000 | Reid et al. | 205/157 |
| 6,151,532 A | 11/2000 | Barone et al. | 700/121 |
| 6,156,167 A | 12/2000 | Patton et al. | 204/270 |
| 6,159,354 A | 12/2000 | Contolini et al. | 205/96 |
| 6,162,344 A | 12/2000 | Reid et al. | 205/157 |
| 6,162,488 A | 12/2000 | Gevelber et al. | 427/8 |
| 6,168,695 B1 | 1/2001 | Woodruff et al. | 204/297.8 |
| 6,179,983 B1 | 1/2001 | Reid et al. | 205/96 |
| 6,193,859 B1 | 2/2001 | Contolini et al. | 204/224 R |
| 6,199,301 B1 | 3/2001 | Wallace | 34/623 |
| 6,228,232 B1 | 5/2001 | Woodruff et al. | 204/242 |
| 6,234,738 B1 | 5/2001 | Kimata et al. | 414/416 |
| 6,318,951 B1 | 11/2001 | Schmidt et al. | 414/744.5 |
| 6,322,112 B1 | 11/2001 | Duncan | 289/1.5 |
| 6,322,677 B1 | 11/2001 | Woodruff et al. | 204/297.06 |
| 6,342,137 B1 | 1/2002 | Woodruff et al. | 204/297.06 |
| 6,391,166 B1 | 5/2002 | Wang | 204/224 R |
| 2002/0008037 A1 | 1/2002 | Wilson et al. | |
| 2002/0125141 A1 | 9/2002 | Wilson et al. | |
| 2002/0139678 A1 | 10/2002 | Wilson et al. | |

OTHER PUBLICATIONS

Lowenheim, Frederick A., "Electroplating," 1978, pp. 416–425, McGraw–Hill, Inc.

Ritter, G., "Two–and Three—Dimensional Numberical Modeling of Copper Electroplating for Advanced ULSI Metallization," Basic Models to Enhance Reliability, Jun. 1999, pp. 1–13, E–MRS Conference Symposium, France.

U.S. patent application Ser. No. 60/206,663, Wilson et al., filed May 24, 2000.

U.S. patent application Ser. No. 08/990,107, Hanson et al., filed Dec. 15, 1997.

U.S. patent application Ser. No. 09/114,105, Woodruff et al., filed Jul. 11, 1998.

U.S. patent application Ser. No. 09/618,707, Hanson et al., filed Jul. 18, 2000.

U.S. patent application Ser. No. 09/679,928, Woodruff et al., Oct. 05, 2000.

\* cited by examiner

LIFT AND ROTATE ASSEMBLY FOR USE IN A WORKPIECE PROCESSING STATION AND A METHOD OF ATTACHING THE SAME

CROSS-REFERENCE TO RELATED APPLICATIONS

This application is a continuation-in-part application of U.S. patent application Ser. No. 09/604,198, filed Jun. 27, 2000 (now U.S. Pat. No. 6,342,137), which is a divisional of U.S. patent application Ser. No. 09/351,980, filed Jul. 12, 1999, and issued on Jan. 2, 2001 as U.S. Pat. No. 6,168,695. This application is also related to the following:

(a) U.S. application Ser. No. 09/875,300 entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed concurrently, and identified by Perkins Coie LLP Docket No. 291958153US;

(b) U.S. application Ser. No. 09/875,428 entitled "INTEGRATED TOOLS WITH TRANSFER DEVICES FOR HANDLING MICROELECTRONIC WORKPIECES," filed concurrently, and identified by Perkins Coie Docket No. 291958153US1;

(c) U.S. application Ser. No. 09/875,304 entitled "DISTRIBUTED POWER SUPPLIES FOR MICROELECTRONIC WORKPIECE PROCESSING TOOLS," filed concurrently, and identified by Perkins Coie Docket No. 291958155US;

(d) U.S. application Ser. No. 09/875,365 entitled "ADAPTABLE ELECTROCHEMICAL PROCESSING CHAMBER," filed concurrently, and identified by Perkins Coie LLP Docket No. 291958156US;

(e) U.S. application Ser. No. 09/872,151 entitled "APPARATUS AND METHODS FOR ELECTROCHEMICAL PROCESSING OF MICROELECTRONIC WORKPIECES," filed May 31, 2001, and identified by Perkins Coie Docket No. 291958158US;

(f) U.S. application Ser. No. 09/849,505 entitled "TUNING ELECTRODES USED IN A REACTOR FOR ELECTROCHEMICALLY PROCESSING A MICROELECTRONIC WORKPIECE," filed May 4, 2001, and identified by Perkins Coie Docket No. 291958157US1.

TECHNICAL FIELD

The present invention is directed to an apparatus for processing of semiconductor wafers, and in particular, to a processing tool with a lift and rotate assembly for use in processing the wafers.

BACKGROUND OF THE INVENTION

Microelectronic devices are generally fabricated on and/or in microelectronic workpieces using different types of machines that typically perform several processing steps in one or more processing stations. To more fully automate the process and minimize operator handling, tools often have multiple processing stations and robotic handling equipment for moving semiconductor wafers or other types of workpieces from one processing station to the next.

One consideration for the tool architecture is the overall size of a tool. This is because integrated circuits are typically fabricated in clean rooms that are expensive to construct and maintain, which is related to the size of the space. As a result, efforts and developments that reduce the overall tool size can have a significant cost benefit.

Tool size can often be an important consideration when adding to and/or updating a particular tool in a line. If the size and shape of the new tool is equal to or smaller than the available space, or the space created by the removal of the old tool being replaced, the impact on nearby tools is minimized. In contrast, when a new or replacement tool is larger than the available space, or the space required by the previous tool, it can potentially require the adjustment and/or relocation of the placement of nearby tools.

One reason to update one or more tools in a semiconductor manufacturing line is to make a transition from a smaller to a larger wafer size. The use of larger wafer sizes is desirable because it enables a greater number of devices to be manufactured on each wafer. By producing more devices on each wafer the cost of manufacturing each device can often be reduced. For example, although the standard wafer size for many semiconductor manufacturing lines is 200 millimeters, there is an increasing trend toward using 300 millimeter wafers. Therefore, efforts at minimizing or maintaining tool size while also enabling the tool to handle larger wafer sizes would similarly be beneficial.

Another consideration for the tool architecture is ease of maintenance. Occasionally individual processing stations or individual components need to be removed for replacement or regular cleaning maintenance. The easier it is to service the assembly or subassembly requiring maintenance, the less time a tool will be down or out of service.

The downtime for such tools is an important performance parameter in light of the large capital cost for the tools and the costs of clean room environments. In clean room environments, personnel typically wear protective clothing including gloves, coats, masks, etc., which can make even routine tasks more cumbersome. Therefore improvements in accessibility of installed assemblies and/or subassemblies and the ease of installation and/or removal of the same would similarly be beneficial.

SUMMARY

The present invention is directed toward a lift and rotate assembly for use in a workpiece processing tool. Several embodiments of the lift and rotate assembly are mounted to the tool so that they enhance the use of space inside a cabinet of a tool. This provides more room for larger processing stations and/or reduces the "foot print" of the tool (i.e., the floor space occupied by the tool). For example, larger processing stations for larger wafers (e.g., 300 mm) can be used in at least approximately the same space as was previously possible for smaller wafers (e.g., 200 mm). Several embodiments of the lift and rotate assembly also provide easy access to the mechanical and electrical components of the lift/rotate assemblies without having to remove the lift and rotate assembly from the tool. This feature reduces the time for servicing and repairing of the lift/rotate assemblies. Additionally, the mechanical and electrical components of the lift/rotate assemblies can be accessed without having to open a lower compartment of the cabinet where the chemical storage tanks and fluid lines are housed. This is beneficial because operators and other personnel are not exposed to chemical vapors when the lift/rotate assemblies are serviced. Several embodiments of lift/rotate assemblies also provide easy access to reaction chambers and other components in the cabinet because they can tilt outward without having to be removed from the cabinet to reduce the time and effort required to service components of the tools inside of the cabinet.

In one embodiment, the lift and rotate assembly comprises a body and a process head for receiving a workpiece. The body contains a lift mechanism for lifting a portion of the body and the process head as a unit with respect to another portion of the body that mounts to the processing tool. The process head is rotatably coupled to the body to enable the process head to rotate with respect to the body and the processing tool. Under one aspect of the invention, the lift and rotate assembly is a modular unit removably attached to an exterior portion of the workpiece processing tool in a position that can be easily accessed and serviced from outside of the workpiece processing tool. The modular unit provides an increased flexibility for changing the configuration of the workpiece processing tool and for the interchangeability of the processing components of the tool while minimizing the down time of the processing tool. The modular unit also allows, as one example, the workpiece processing tool to have a smaller footprint in a clean room. Alternatively, the workpiece processing tool can be configured to handle larger workpieces without having to increase the tool's footprint within the clean room.

In one embodiment of the invention, the body of the lift and rotate assembly has first and second portions, the first portion being releasably connected to an exposed surface of the frame of the workpiece processing tool. The body's second portion is connected to the first portion and the process head. The body's second portion and process head are movable relative to the first portion between raised and lowered positions. Control components are connected to the body and configured to move the body's second portion between the raised and lowered positions. The body, the control components, and the process head from a modular unit are removable as a unit from the exposed surface of the frame. This modular unit can be easily removed from the frame and replaced with another unit to minimize downtime of the workpiece processing tool.

In one embodiment, the lift and rotate assembly is easily accessible from outside of the processing tool while mounted on the tool's frame. Accordingly, the lift and rotate assembly can undergo service, repair, or maintenance from outside of the processing tool without having to access the interior compartment of the workpiece processing tool.

Under one aspect of the invention, the lift and rotate assembly is pivotable relative to the frame between a forward, operating position and a tilted, service position. In the forward, operating position, the body's first portion is adjacent to the frame, and in the tilted, service position, the body's first portion is tilted away from the frame. When the lift and rotate assembly is in the tilted, service position in one embodiment, the lift and rotate assembly is positioned to allow easy access into the interior area of the workpiece processing tool for service, repair, or maintenance, of other components of the processing tool.

Under another aspect of the invention, the body's first portion includes a housing that contains the control components. An access panel is connected to the housing and is movable relative to the housing between open and closed positions when the body is connected to the frame. A plurality of the control components are mounted on the access panel and are accessible from the exterior of the workpiece processing tool while the lift and rotate assembly is connected to the frame. Accordingly, the control components can be easily and quickly accessed for repair, replacement, or maintenance.

Under another aspect of the invention, a processing tool is provided for processing selected workpieces. The processing tool provides a frame, a deck attached to the frame and a processing chamber coupled to the deck inboard of the frame. A lift and rotate assembly is removably mounted to an exposed surface of the frame and spaced outboard of the deck. The lift and rotate assembly has a body, control components, and a process head. The body is releasably connected to the exposed surface of the frame. The control components are connected to the body and positioned to cause a portion of the body and the process head to move relative to the deck between the raised and lowered positions. The body, the control components, and the processing head are removable from the frame as a unit.

In yet another aspect of the invention, a method is provided for servicing a lift and rotate assembly of a workpiece processing tool. The lift and rotate assembly has a body and a process head connected to the body. The method includes accessing the body from the exterior of the frame when the lift and rotate assembly is mounted on the frame. The body includes a housing that contains control components, and an access panel is mounted on the housing. The method further includes moving the access panel to an open position to expose the control components while the lift and rotate assembly is mounted on the frame, and servicing the control components in the housing from exterior of the workpiece processing tool while the lift and rotate assembly is connected to the frame.

Another method includes moving a second portion and the process head relative to a first portion of the body to the raised position, engaging the body from a position exterior of the frame, and tilting the body and the process head as a unit relative to the frame to a tilted, service position. The method of one embodiment also includes servicing the lift and rotate assembly while connected to the frame and in the tilted, service position.

DETAILED DESCRIPTION

Figure 1:
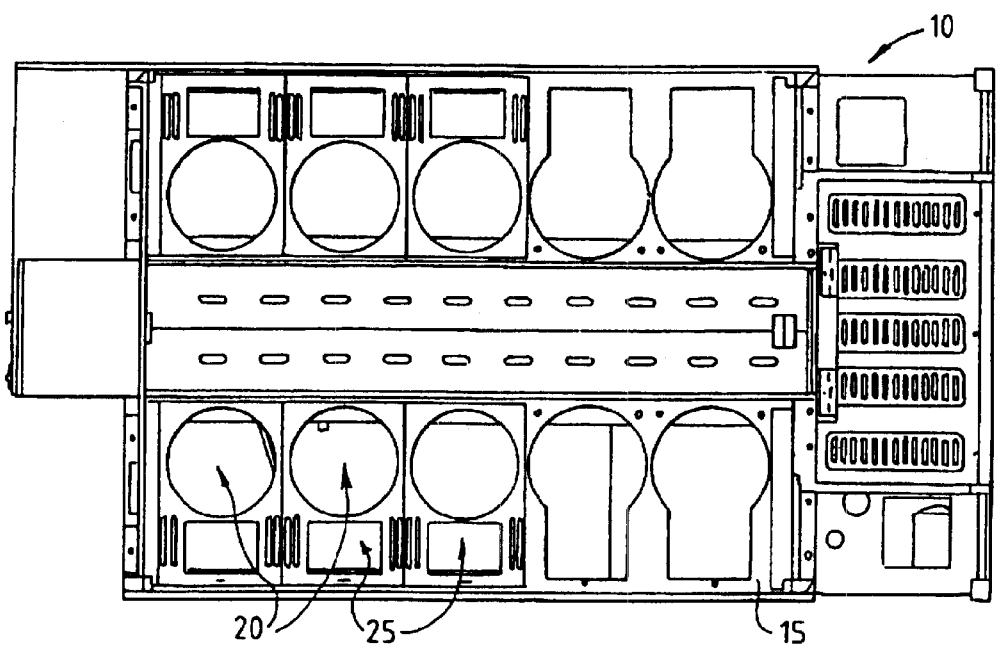
FIG. 1 illustrates a top plan view of a prior art processing tool.

FIG. 1 illustrates a top plan view of one example of a prior art processing tool 10. Specifically, FIG. 1 illustrates a top plan view of the top deck 15 of an LT-210™ processing tool manufactured by Semitool, Inc. The LT-210™ processing tool is a tool architecture designed for processing semiconductor wafers or other workpieces up to 200 millimeters in size, but it can also be configured to process larger or smaller workpieces. The deck 15 includes openings 20 and 25 within which individual processing stations can be received. For example, the openings 20 generally receive the processing chambers/bowls, and the openings 25 generally receive lift and rotate mechanisms. To install a corresponding lift and rotate assembly in this device, the assembly is raised above the opening and a portion of the assembly is inserted into the opening 25.

Figure 2:
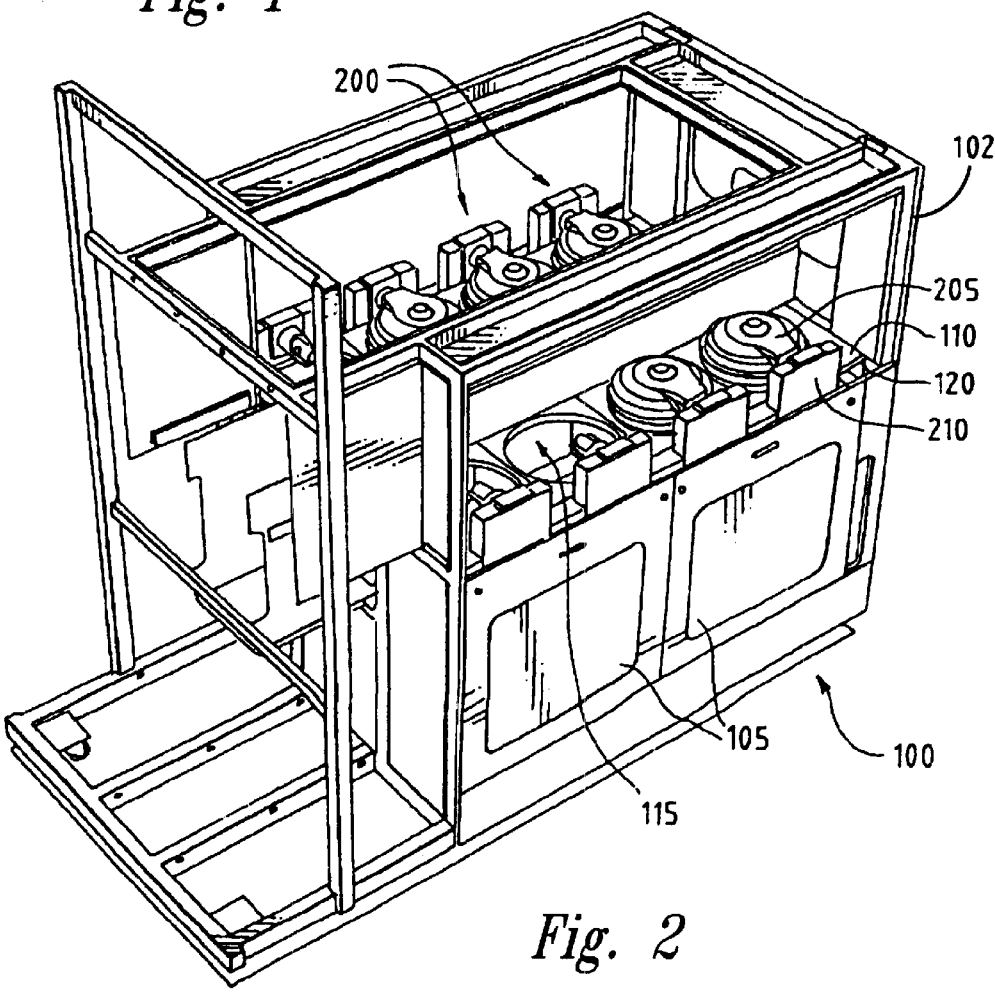
FIG. 2 is an isometric view partially illustrating a processing tool in accordance with one embodiment of the present invention shown with several panels removed.
Figure 7:
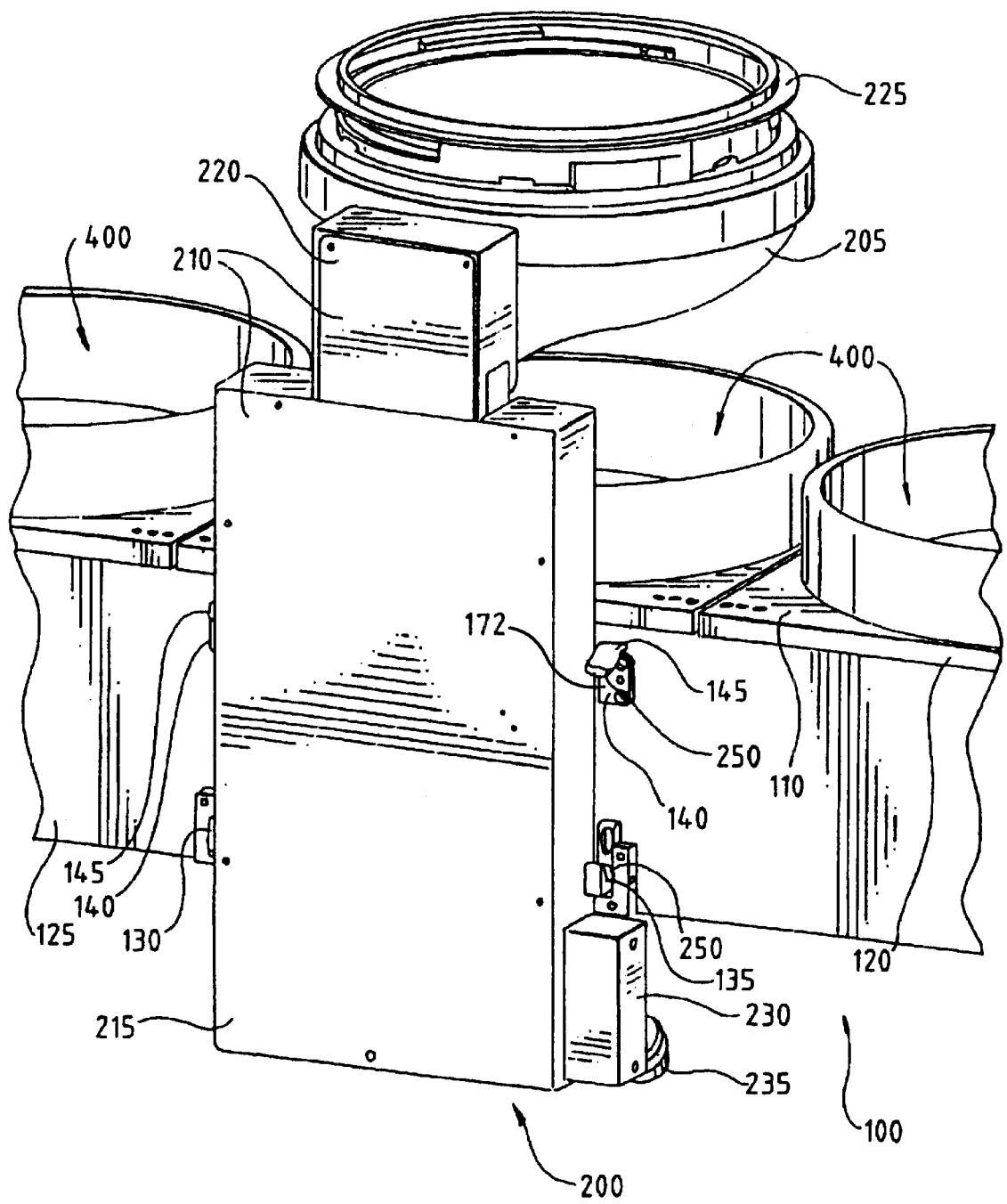
FIG. 7 illustrates an isometric view of the lift and rotate assembly mounted to an exposed surface of a processing tool with the side panel removed to expose the lift and rotate assembly.

FIG. 2 is an isometric view illustrating part of a processing tool 100 in accordance with one embodiment of the present invention. Several of the upper side panels are shown removed; however, a pair of lower side panels 105 are shown still in place attached to a frame 102 of the processing tool 100. FIG. 2 further shows several lift and rotate assemblies 200 installed in the processing tool 100. Some of the lift and rotate assemblies 200 are shown without their corresponding process heads 205. Similar to the processing tool 10 in FIG. 1, the processing tool 100 includes a horizontal deck 110 attached to the frame 102, and the deck has a plurality of openings 115 that receive processing chambers/bowls 400 (FIG. 7). The lift and rotate assemblies 200 are positioned so the processing heads 205 are positionable over a respective opening 115 and the processing bowl 400 in that opening.

The lift and rotate assemblies of the prior art processing tool 10 (FIG. 1) have openings 25 in the deck 10 within which the lift and rotate assemblies are received, but the embodiment illustrated in FIG. 2 includes lift and rotate assemblies 200 attached at the back edge 120 of the deck 110. This enables more room on the deck for accommodating larger processing chambers/bowls 400 (FIG. 7) capable of handling larger wafer sizes without changing the size of the processing tool's footprint in, as an example, a clean room. Alternatively, a smaller deck 110 can be used to reduce the footprint of the processing tool 100 in the clean room. The lift and rotate assemblies 200 can be used in conjunction with the processing chambers/bowls 400 (FIG. 7) to provide for processes including plating processes, rinse/dry processes, electroless plating processes, and/or immersion chamber processes.

Figure 3:
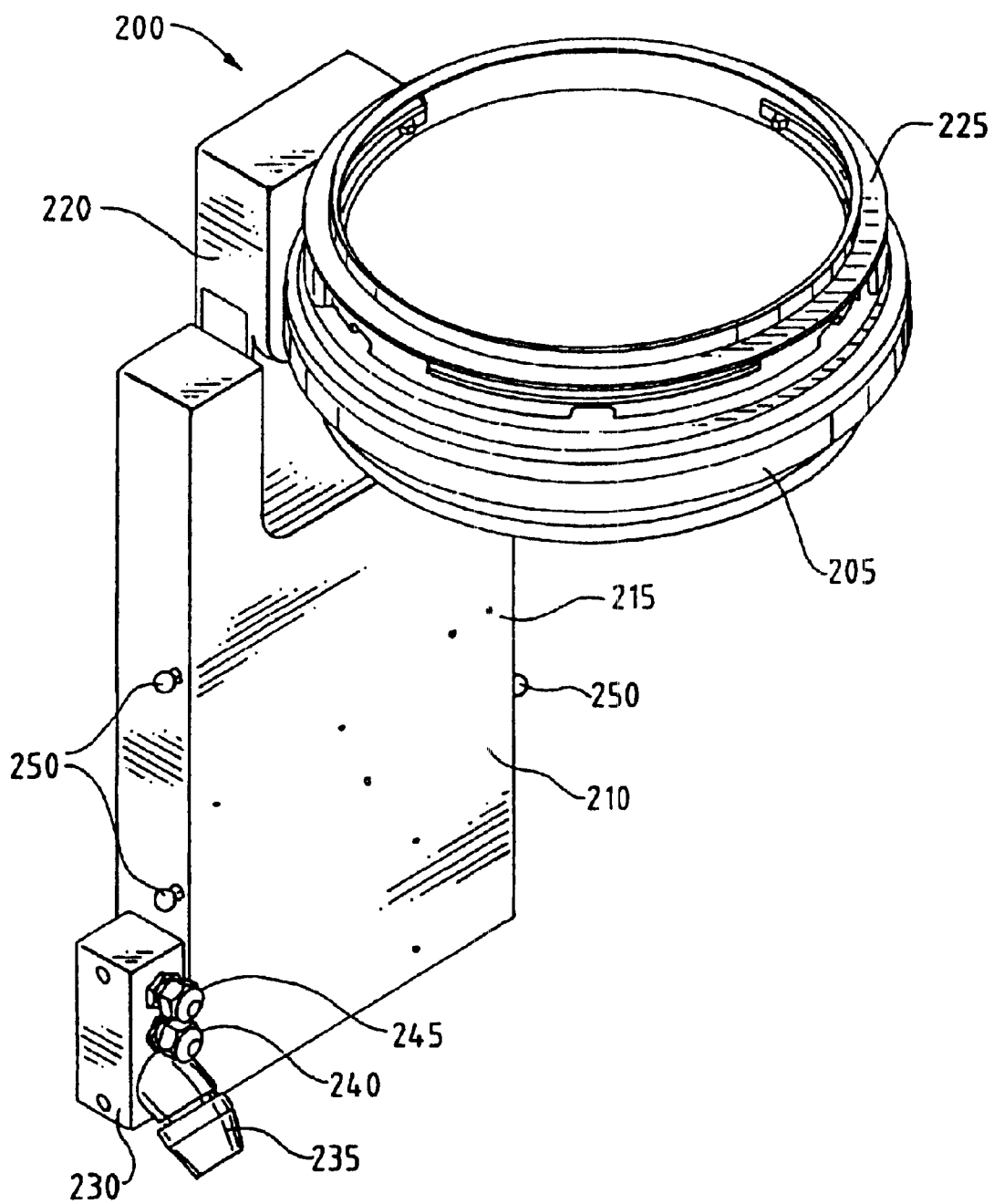
FIG. 3 illustrates an enlarged isometric front view of a lift and rotate assembly removed from the processing tool of FIG. 2 and showing a process head lifted vertically into a raised position with the process head rotated up into a load position.
Figure 4:
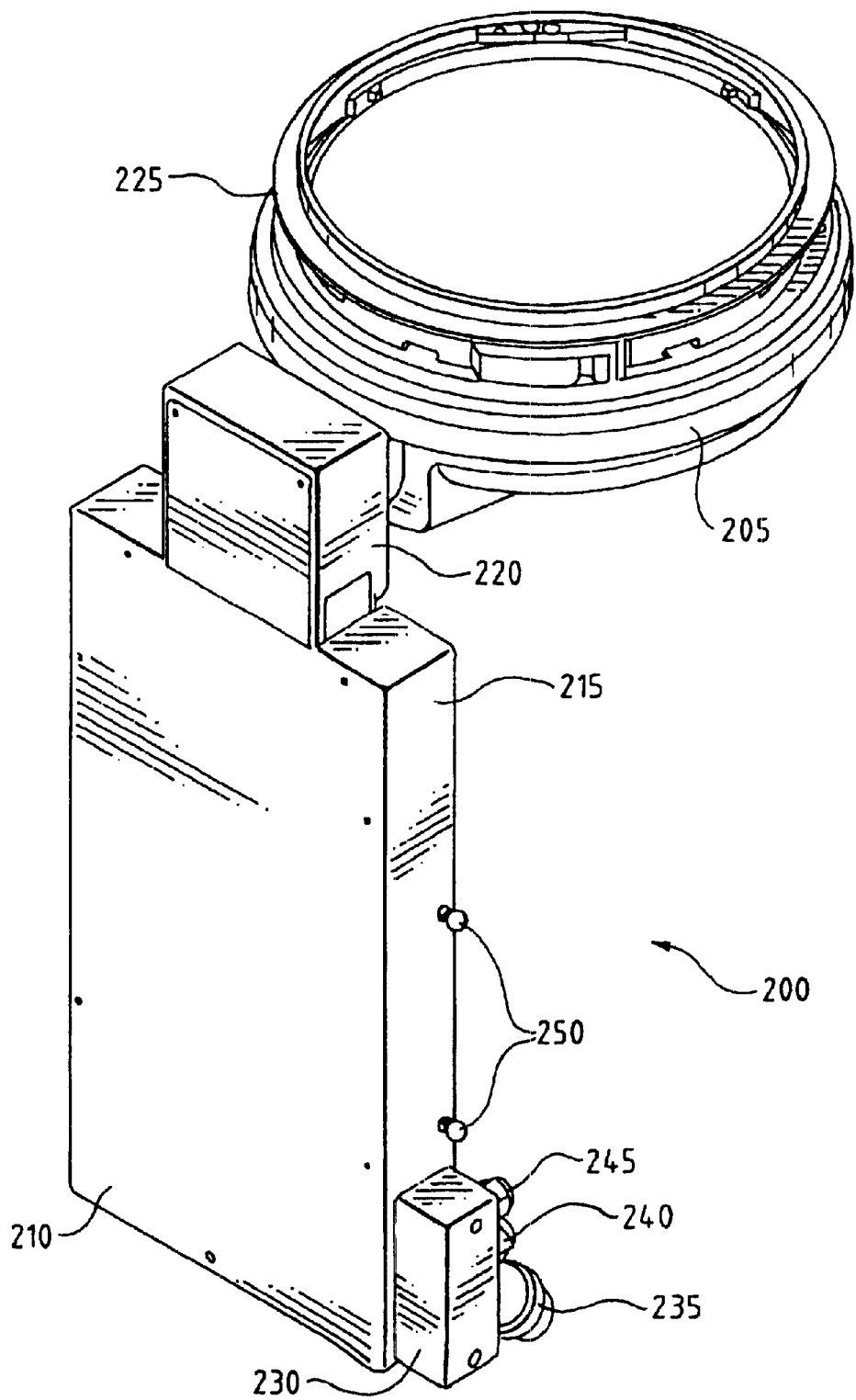
FIG. 4 illustrates an isometric back view of the lift and rotate assembly illustrated in FIG. 3.

FIGS. 3 and 4 illustrate an isometric view of each of the front and back view of the lift and rotate assembly 200 of one embodiment. The lift and rotate assembly 200 includes a process head 205 and a base 210. The process head 205 is rotatably coupled to the base 210 by a rotating mechanism more clearly shown in connection with FIG. 11. The base 210 includes a first portion 215 and a second portion 220. The second portion 220 is adapted to be capable of being lifted with respect to the first portion 215 to a raised position. Specifically, the process head 205 is coupled to the second portion 220 of the base 210 to move with the second portion 220 as it moves with respect to the first portion 215 between raised and lowered positions. In one particular embodiment, the process head 205 has a single ring contact 225 for holding a wafer during a processing cycle. In at least one embodiment the ring contact provides power to the wafer.

The base 210 includes a connection box 230 having terminals through which signals (e.g., communication and power signals), gases, and fluids can be received. In one embodiment, the connection box 230 includes a terminal 235 that receives electronic signals, a terminal 240 that receives plating power, and a terminal 245 that receives gases for actuating the pneumatics and for a backside nitrogen ($N_2$) purge. The body 210 further includes a pair of pins 250 (one not shown) on each side of the body 210. The pins 250 are adapted for removably mounting the lift and rotate assembly 200 to the frame 102 of the processing tool 100, shown in FIG. 2. Accordingly, the lift and rotate assembly forms a modular component that can be removed from the frame as a unit, and if needed, replaced by another assembly. This modularity decreases the downtime of the processing tool that may be required for service, repair, or maintenance.

Figure 6:
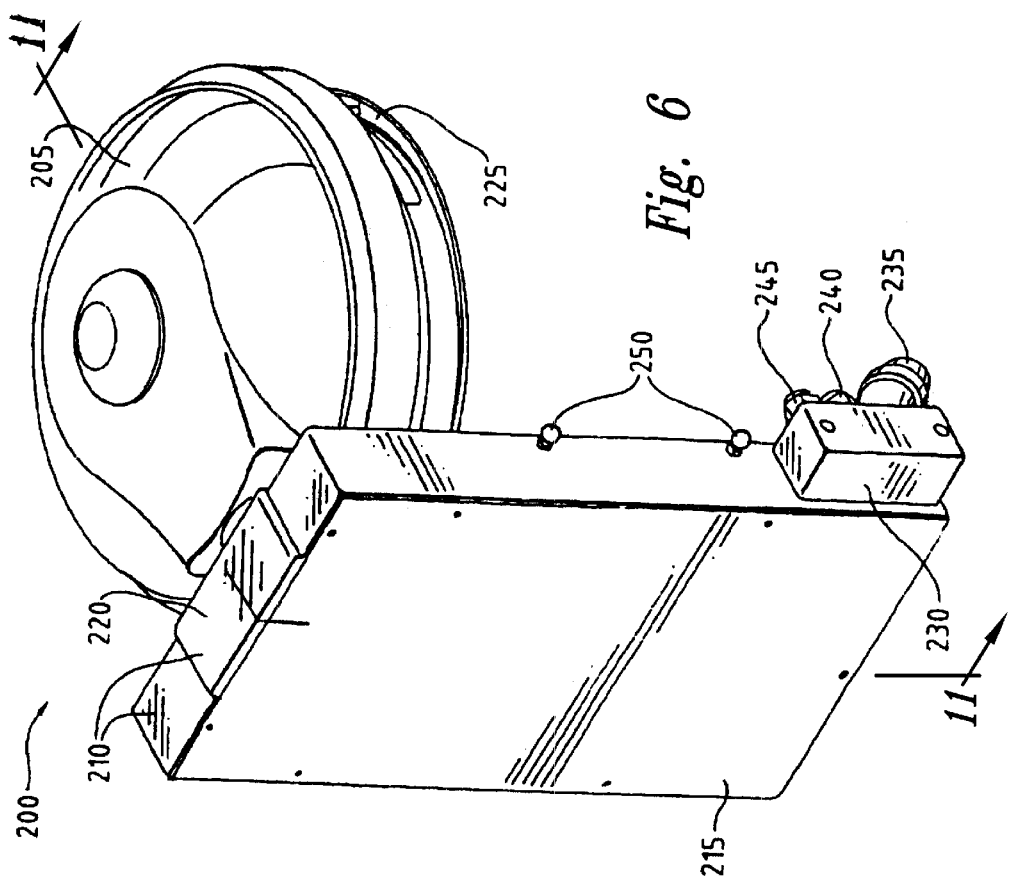
FIG. 6 illustrates an isometric back view of the lift and rotate assembly illustrated in FIG. 5.
Figure 5:
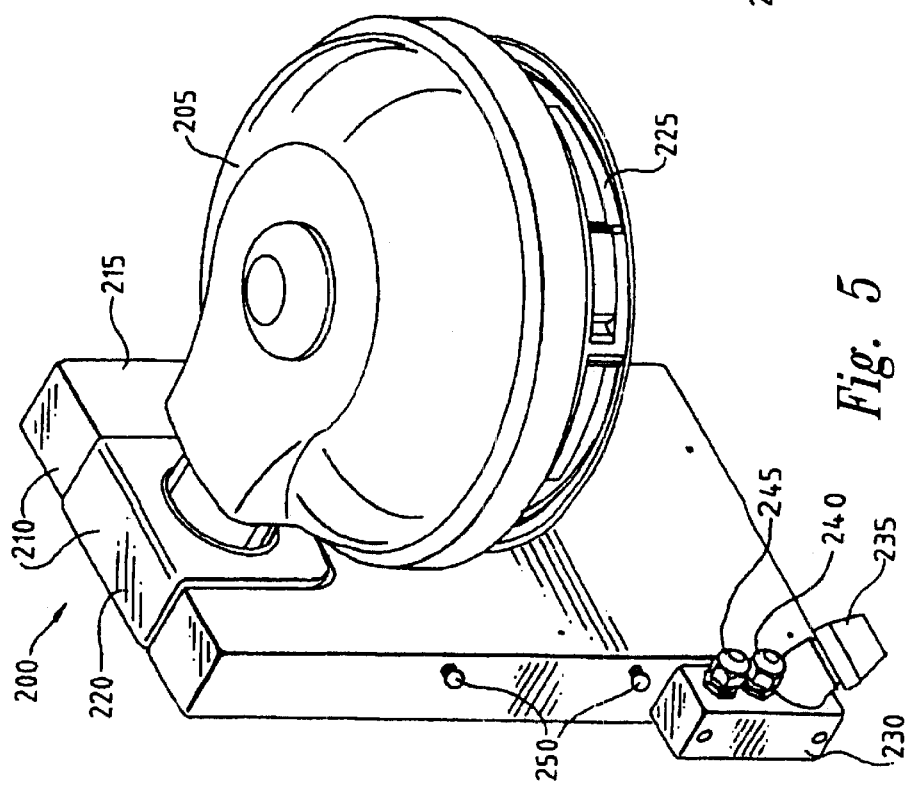
FIG. 5 illustrates an enlarged isometric front view of the lift and rotate assembly removed from the processing tool of FIG. 2 and showing the process head lowered vertically into a lowered position with the process head rotated down into a processing position.

FIGS. 5 and 6 are isometric views of each of the front and back view of the lift and rotate assembly 200 showing the process head 205 and the base's second portion 220 in a lowered position relative to the base's first portion 215. The process head 205 is also shown rotated down into a processing position so the ring contact 225 faces downwardly.

Otherwise the features are very similar to the ones shown in FIGS. 3 and 4.

FIG. 7 is an isometric view of the lift and rotate assembly 200 mounted to an exposed surface 125 of the frame 102 adjacent to the back edge 120 of the deck 110. The side panel 105 shown in FIG. 2 has been removed for purposes of clarity. On the exposed surface 125 of the processing tool 100 is a socket 130, a saddle 135, and a pair of adjustable surfaces 140 that are configured to releasably support the lift and rotate assembly 200 in a selected position and orientation relative to the frame 102. A pair of clips 145 holds the two top pins 250 with respect to each of the adjustable surfaces 140. It is noted that the clips 145 can have different configurations. A couple of examples include a screw-on-clamp or a self-retaining spring clip. Processing chambers/bowls 400 are shown in FIG. 7 projecting from the openings 115 through the deck 110 inboard of the lift and rotate assemblies 200 and below the processing head 205 (shown in the raised position).

Figure 8:
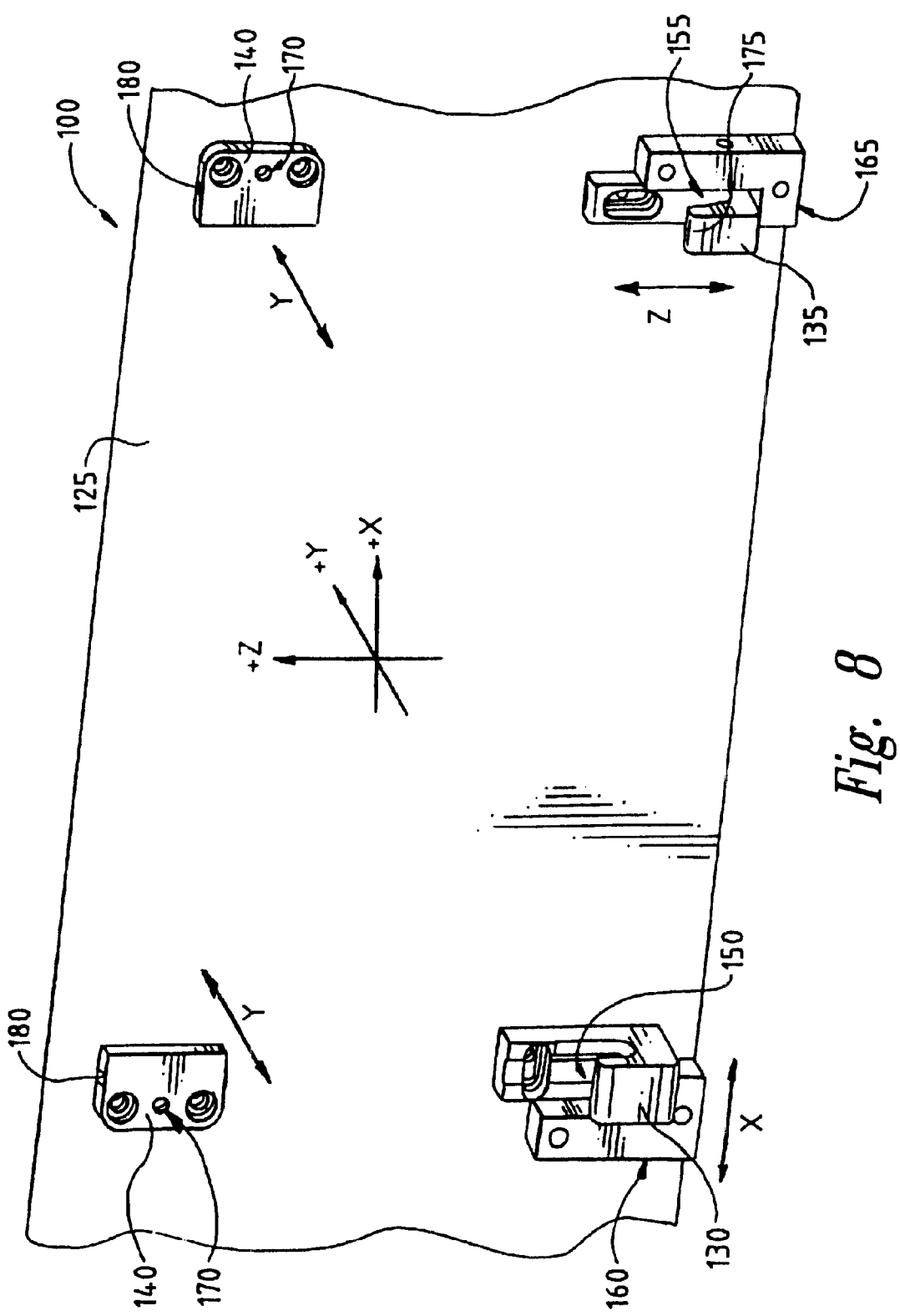
FIG. 8 illustrates an isometric view of the socket, saddle, and adjustable surfaces, coupled to an exposed surface of the processing tool, within and against which the pins of the lift and rotate assembly rest.

FIG. 8 illustrates an isometric view of an embodiment of the socket 130, saddle 135, and adjustable surfaces 140 on an exposed surface 125 of the processing tool 100. The lower pins 250 (FIGS. 6 and 7) of the lift and rotate assembly 200 are adapted to rest in the socket 130 and saddle 135 and engage the adjustable surfaces 140. The socket 130 in this first embodiment includes a spherical recess 150 for receiving a pin 250, and has a jack screw 160 for adjusting the socket 130 in a direction shown by the arrow labeled X. The saddle 135 includes a cylindrical groove 155 for receiving a pin 250, and similarly has a jackscrew 165 for adjusting the saddle 135 in a direction shown by the arrow labeled Z. A pair of jackscrews 170 enables the adjustable surfaces 140 to be adjusted in a direction shown by the arrows labeled Y. Accordingly, the position of the saddle 135 and the socket 130 can be easily and quickly adjusted, thereby insuring that the process head 205 will be precisely positioned relative to the chamber's/bowls 400 (FIG. 7) during a workpiece processing procedure.

Initially, when the lift and rotate assembly 200 is being installed, the lower left pin 250 is placed in the spherical groove 150 of the socket 130. With the lower left pin in place, the lower right pin 250 is then lifted up and over the lip 175 of the saddle 135 and lowered into the cylindrical groove 155. Aided by the weight of the process head 205, the center of gravity causes the remaining two upper pins 250 of the lift and rotate assembly 200 to fall in the direction of the process head 205 until it comes into contact with the adjustable surfaces 140. To provide greater stability, the upper pins 250 of the lift and rotate assembly 200 are held against a flat engagement 172 on the adjustable surfaces 140. A pair of the clips 145 (FIG. 7) are attached to the adjustable surfaces 140 in holes 180 located at the top of the adjustable surface. When in place, the clips 145 extend over and around the upper pins 250, as shown in FIG. 7.

The socket 130, the saddle 135, and the adjustable surfaces 140 can each be independently adjusted to provide proper alignment of the lift and rotate assembly 200 so that the process head 205 is accurately aligned with the process chamber/bowl 400 (FIG. 7). Adjustment of the socket 130, the saddle 135, and the adjustable surfaces 140 is provided by turning one or more of the respective jackscrews 160, 165, and 170.

By attaching the lift and rotate assembly 200 to the exposed surface 125 of the processing tool 100 via the pins 250 and corresponding hardware 130, 135 and 140, the lift and rotate assembly can be readily attached and detached from the processing tool 100. Furthermore, the lift and rotate assembly 200 is adjacent to the deck 110 so the full surface of the deck can then be used to provide the openings 115 for the processing chamber/bowls 400. This allows a larger bowl size without increasing the processing tool's footprint and/or a smaller deck size that allows for a smaller footprint.

Another factor that influences the available space on the deck 110 is the depth D of the body 210. The depth of the body 210 is affected by the arrangement of the mechanical and electrical components inside or on the body 210.

Figure 9:
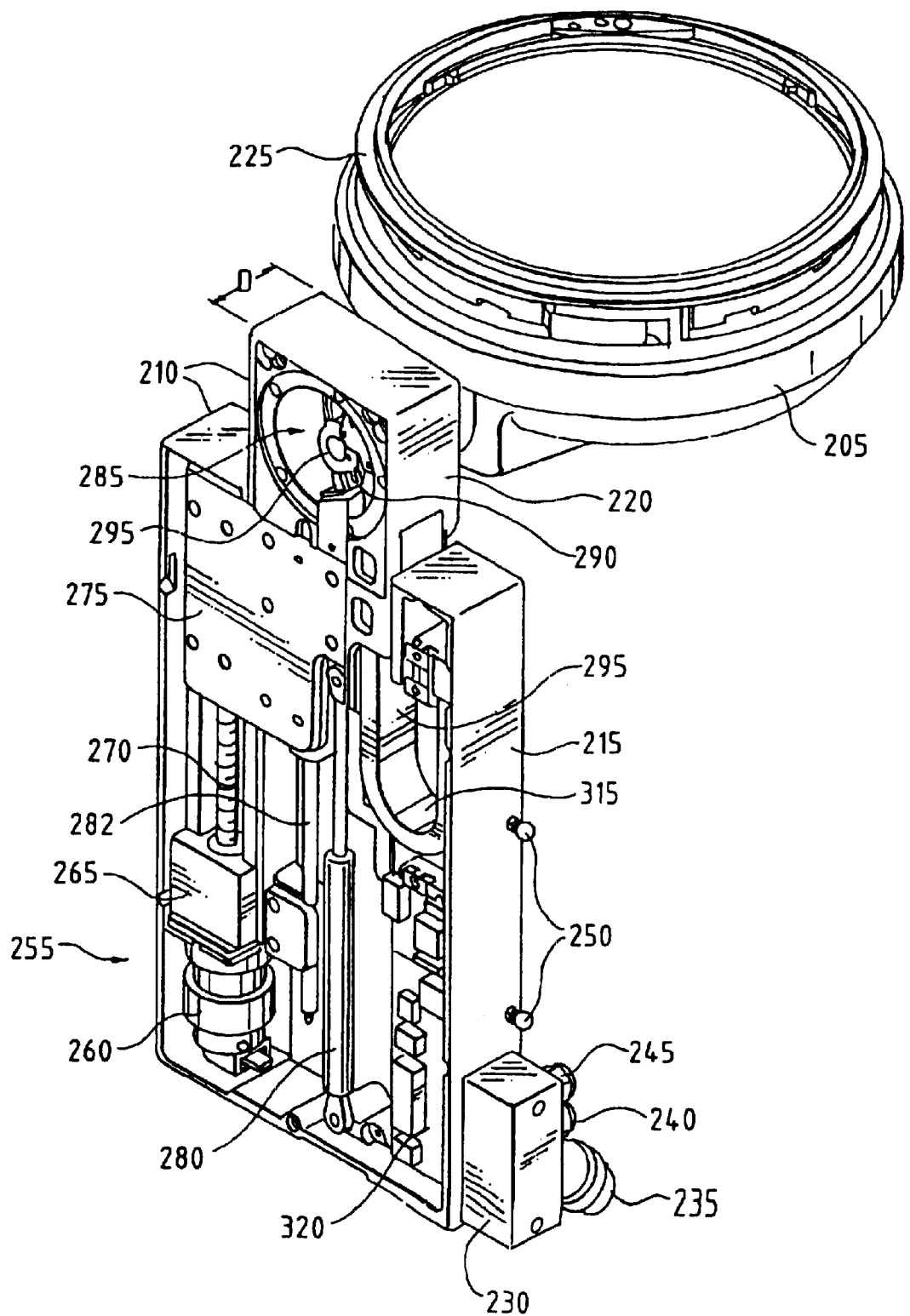
FIG. 9 illustrates an isometric back view of the lift and rotate assembly of FIG. 4 with the back covers removed.
Figure 10:
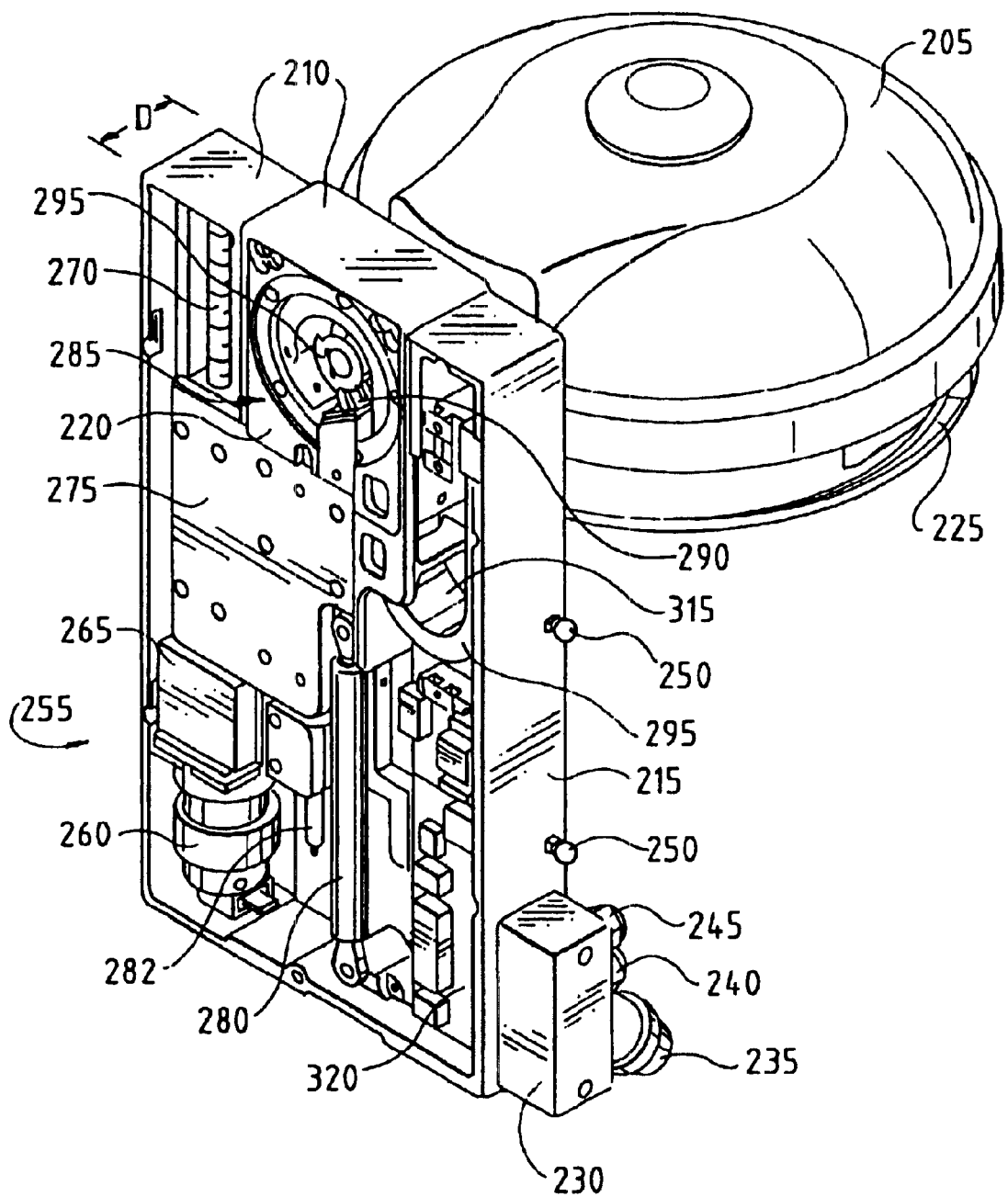
FIG. 10 illustrates one isometric back view of the lift and rotate assembly of FIG. 6 with the back covers removed.

FIGS. 9 and 10 illustrate the lift and rotate assembly of FIGS. 4 and 6 with the back covers removed to show the internal structure of the body 210 of the lift and rotate assembly 200. The one embodiment of the lift and rotate assembly 200 illustrated in FIGS. 9 and 10 include a lift mechanism 255. The lift mechanism 225 includes a lift axis motor 260, a lift actuator 265, and a ball screw 270 driven by the actuator 265. As the ball screw turns, a guide block 275 travels up and down the ball screw 270. The guide block 275 is coupled to the second portion 220 of the body 210 so that rotation of the ball screw 270 raises/lowers the second portion 220 of the body 210 relative to the first portion 215 of the body.

A compressed gas spring 280 is coupled between the first portion 215 and the second portion 220 of the body 210. The gas spring 280 provides a counterbalance force approximately equivalent to the force of gravity being exerted on the process head 205 and related components. This reduces the force required by the lift axis motor 260 for raising and lowering the process head 205. The illustrated embodiment of FIGS. 9 and 10 further includes a linear encoder 282 for providing absolute position coordinates to the lift mechanism 255.

Located within the second portion 220 of the body 210 is a rotate axis assembly 285. The rotate axis assembly 285 includes a sensor 290 and a sensor flag 295 for monitoring the rotational movement of the process head 205. The rotate axis assembly 285 is coupled to a rotating mechanism 300 (FIG. 11) including a motor 305 (FIG. 11) located in the process head 205. The shaft 310 of the motor 305 is coupled to and rotationally fixed with respect to the body 210. By fixing the motor shaft 310 to the body's second portion 220, the motor 305 rotates about the shaft to correspondingly rotate the process head 205 relative to the body. This enables the bulk of the motor 305 to be located in the processing head 205 to reduce the depth D (FIG. 10) of the body 210.

The process head 205 receives at least one of signals, gases, and fluids from the signals, gases, and fluids supplied to the lift and rotate assembly 200 via the connection box 230 and a cable assembly 295. The cable assembly 295 includes a cable loop 315 for feeding additional length of cable to compensate for movement by the lift mechanism 255 and the rotating mechanism 300. In this embodiment, the rotating mechanism 300 is aligned with the lift mechanism 255 to provide a common direction of movement. By providing a common direction of movement, a single cable loop 315 can provide additional cable length for both the lift direction of movement and the rotational direction of movement. This eliminates the need for a second cable loop to further conserve space within the body 210 of the lift and rotate assembly 200.

The base 210 further includes circuitry 320 for controlling the functioning of the lift and rotate assembly 200. In this embodiment, the circuitry 320 is housed within the cavity of the base.

A substantial portion of the rotating mechanism 300 in this embodiment is located in the head. By locating the bulk of the rotating mechanism 300 in the process head 205 and eliminating the need for a second cable loop, more space is conserved in the base 210 of the lift and rotate assembly 200. Correspondingly this allows for the depth D of the lift and rotate assembly 200 to be reduced and greater space on the deck 110 of the processing tool 100 to be available for the processing chamber/bowl 400.

Figure 11:
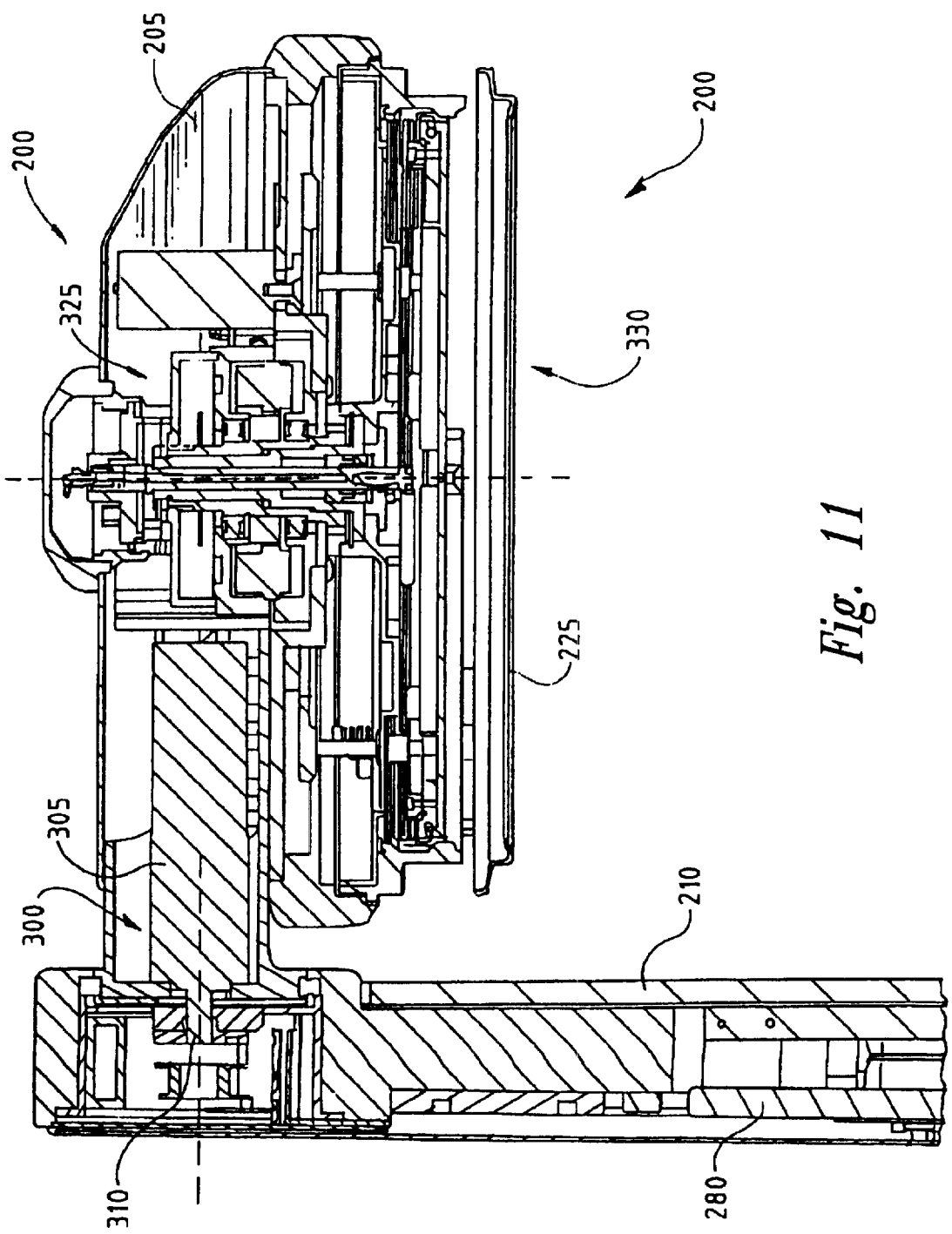
FIG. 11 illustrates an enlarged side cross sectional view taken substantially along lines 11—11 of FIG. 6 showing the lift and rotate assembly rotated down in the processing position.

FIG. 11 illustrates a cross-sectional view of the lift and rotate assembly rotated down in the processing position. In addition to illustrating the presence of the bulk of the motor for the rotating mechanism 300 in the processing head, FIG. 11 illustrates a second motor 325 adapted for spinning a workpiece loaded in the process head in a plane parallel to the face 330 of the process head 205.

Figure 12:
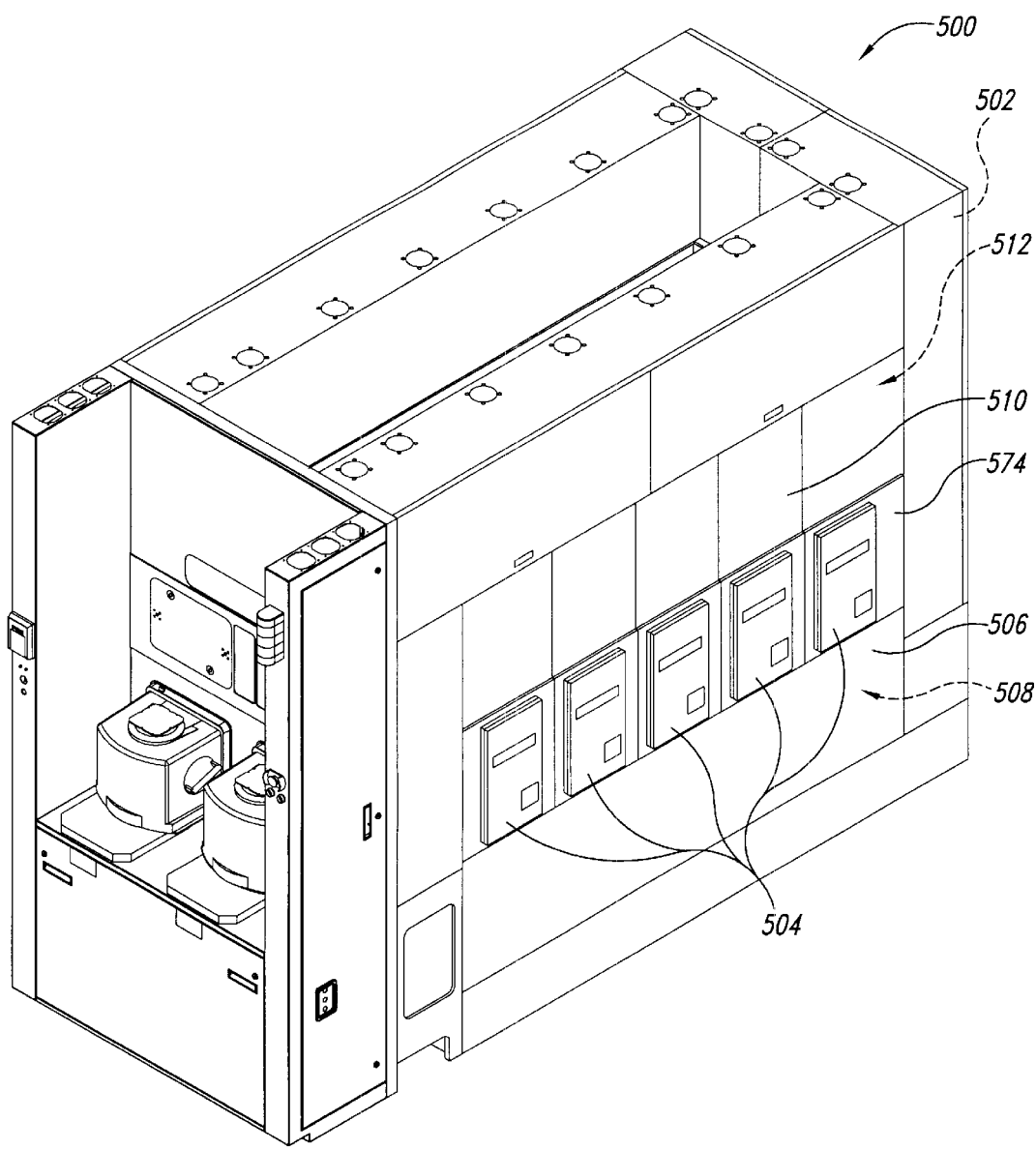
FIG. 12 illustrates an isometric view of a workpiece processing tool in accordance with an alternate embodiment of the present invention, the processing tool shown with lift and rotate assemblies in a forward, operating position.

FIG. 12 illustrates an isometric view of a workpiece processing tool 500 in accordance with an alternate embodiment of the invention. The processing tool 500 includes an internal frame 502 and a plurality of lift and rotate assemblies 504 mounted to an exterior surface of the frame in a position easily accessible from the outside of the workpiece processing tool. The processing tool 500 of the illustrated embodiment has ten lift and rotate assemblies 504 (five on each side). Greater or fewer lift and rotate assemblies can be installed on processing tools of other embodiments. Lower close-out panels 506 are removably attached to lower portions of the frame 502 below the lift and rotate assemblies to close out the workpiece processing tool's lower compartment area 508. Upper side panels 510 are removably attached to the frame 502 above each of the lift and rotate assemblies 504. The upper side panels 510 and the lift and rotate assemblies 504 close out the upper compartment area 512 of the workpiece processing tool 500.

Figure 13:
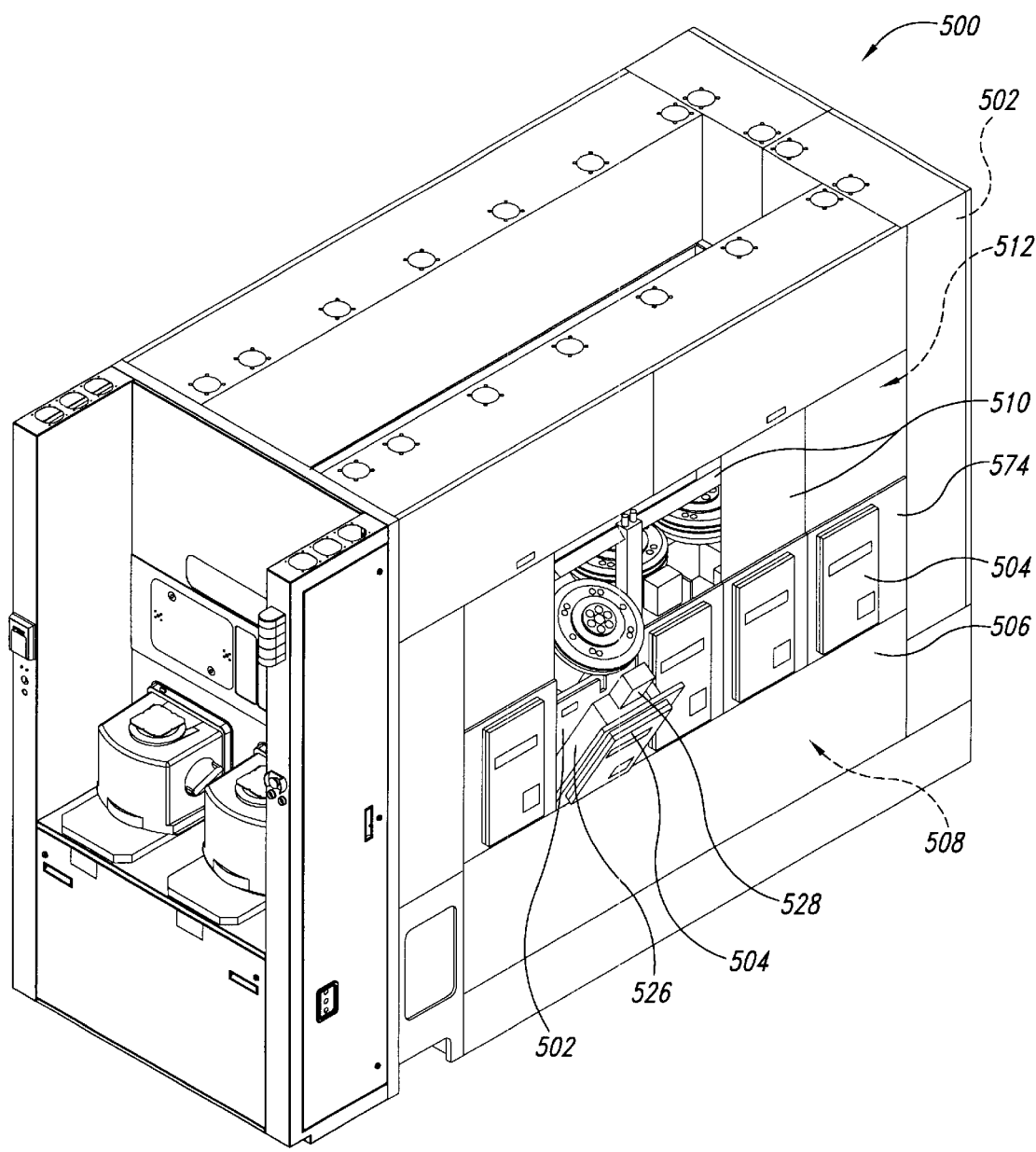
FIG. 13 illustrates an isometric view of the workpiece processing tool of FIG. 12 with two upper panels removed and one of the lift and rotate assemblies in a tilted, service position.

FIG. 13 illustrates an isometric view of the processing tool 500 with two of the upper side panels 510 in an open position. One of the lift and rotate assemblies 504 attached to the frame 502 is shown in a tilted, service position, and the adjacent lift and rotate assembly is illustrated in the forward, operating position. The lift and rotate assembly 504 can be accessed from the exterior of the processing tool 500 when needed. In one embodiment, the upper side panel 510 above a selected lift and rotate assembly 504 can be opened or removed, and the lift and rotate assembly can then moved to the tilted, service position without the operator having to get into the upper compartment area 512 of the processing tool 500. Accordingly, the lift and rotate assemblies 504 are easily accessible and serviceable, thereby reducing downtime during servicing, repairs, or maintenance. The upper side panels 510 can also be opened to provide access into the upper compartment area 512 of the processing tool 500 for maintenance, repair, or servicing of internal components in the processing tool.

Figure 14:
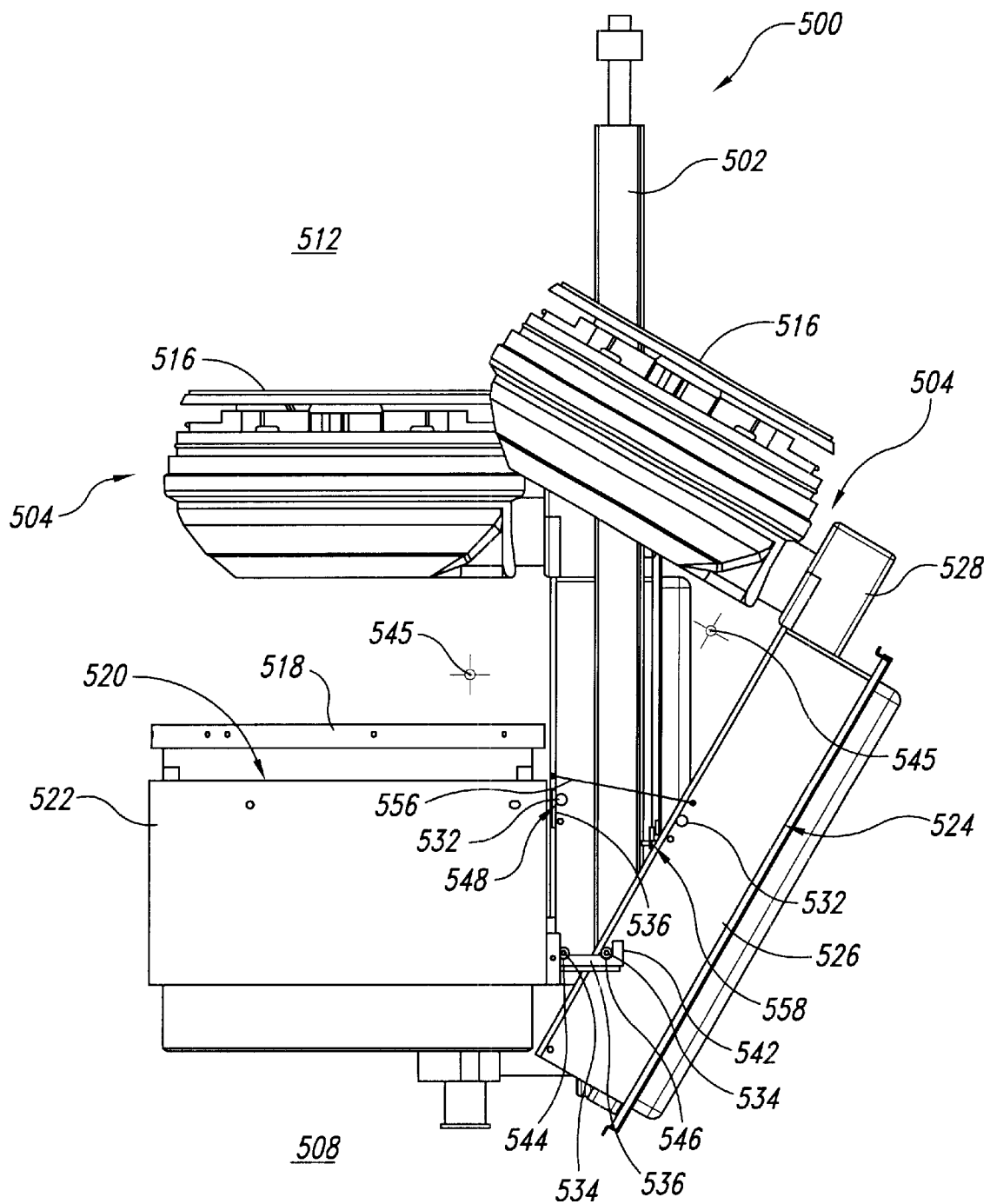
FIG. 14 illustrates an enlarged side elevation view of the lift and rotate assembly of FIG. 13 in the tilted, service position, and a second lift and rotate assembly illustrated in the forward, operating position.

FIG. 14 illustrates two lift and rotate assemblies 504, one assembly being illustrated in the tilted, service position, and the other assembly illustrated in the forward, operating position. The lift and rotate assemblies 504 are also illustrated with the process heads 516 in the raised position. When the lift and rotate assembly 504 is in the forward, operating position, the process head 516 is positioned above a processing chamber or bowl 518 that extends through an opening 520 in the tool's deck 522. The deck 522 is mounted to the interior portion of the frame 502 and divides the interior area of the processing tool 500 into the upper compartment area 512 and the lower compartment area 508.

The lift and rotate assembly 504 illustrated in FIG. 14 includes a main body 524 having a first portion 526 pivotally mounted to the frame 502 and a second portion 528 moveably coupled to the body's first portion 526. The body's second portion 528 is movable relative to the first portion 526 between raised and lowered positions relative to the deck 522 and the bowls 518. The process head 516 is rotatably attached to the body's second portion 528 and moves with the second portion as a unit between the raised and lowered positions. Accordingly, the axial and rotational position of the process head 516 relative to the deck 522 and bowls 518 is controlled via the body's first and second portions 526 and 528.

Figure 15:
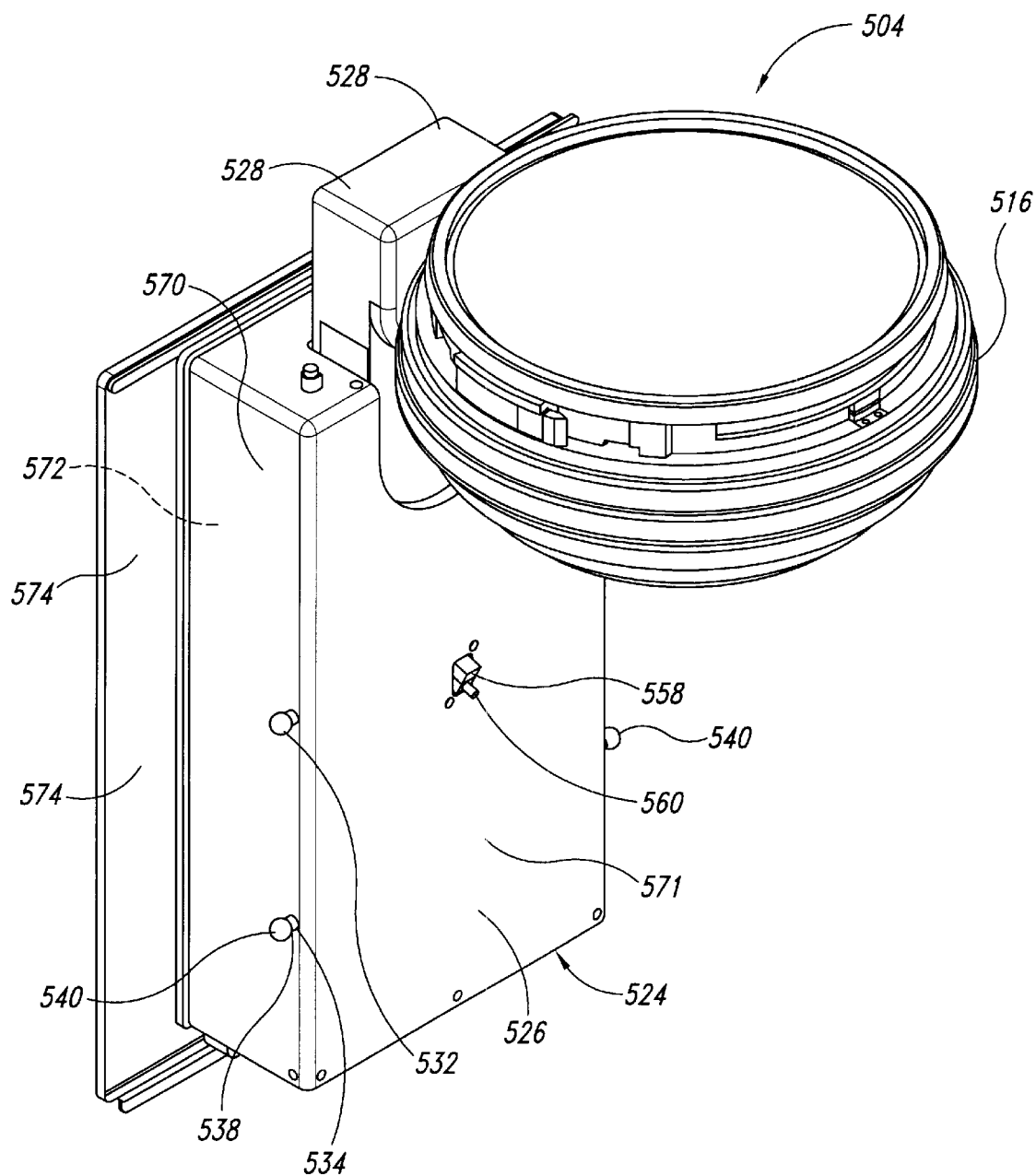
FIG. 15 illustrates an isometric back view of a lift and rotate assembly of FIG. 12 shown removed from the processing tool, and with a process head illustrated in a raised position and rotated into the load position.
Figure 16:
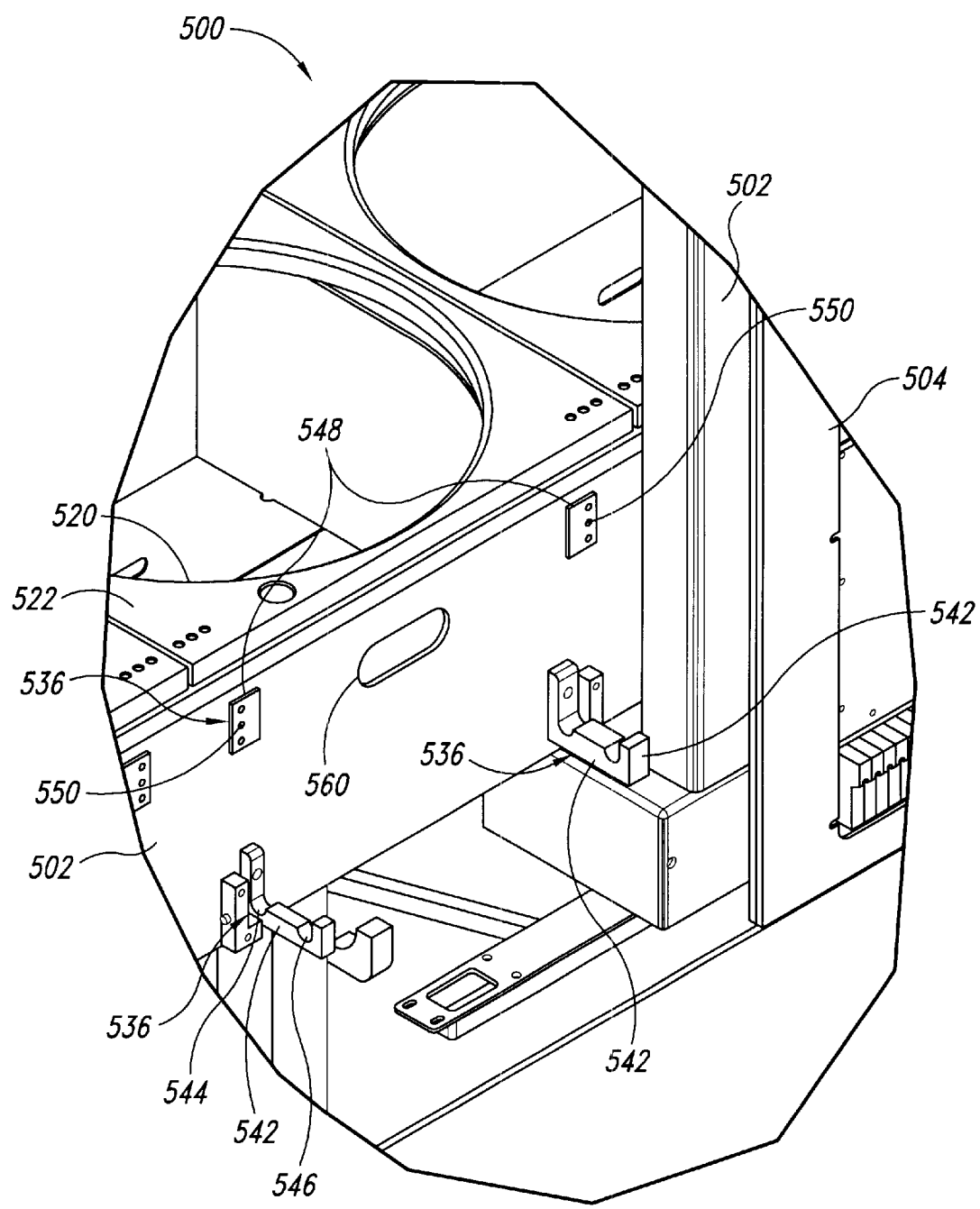
FIG. 16 illustrates an enlarged partial isometric view of the leveling and retaining components on the frame of the processing tool of FIG. 12, with a lift and rotate assembly removed for purposes of clarity.

FIG. 15 illustrates an isometric rear view of the lift and rotate assembly 504 shown removed from the frame 502 of the processing tool 500. FIG. 16 is an enlarged partial isometric view illustrating a portion of the frame 502 with a lift and rotate assembly 504 removed to show leveling and retaining bracketry 536 that removably retains the lift and rotate assembly on the frame. As best seen in FIG. 15, the lift and rotate assembly 504 has a pair of upper mounting pins 532 and a pair of lower mounting pins 534 projecting from the sides of the body's first portion 526. These upper and lower mounting pins 532 and 534 are positioned and adapted to connect to the leveling and retaining bracketry 536 on the frame 502 (FIG. 16) to removably retain the lift and rotate assembly 504 on the frame 502. In the illustrated embodiment, the upper and lower mounting pins 532 and 534 include a shaft portion 538 projecting from the body's first portion 526 and a spherical end portion 540 that engages the leveling and retaining bracketry 536 (FIG. 15).

The leveling and retaining bracketry 536 shown in FIG. 16 includes elongated lower connectors 542 mounted on the frame 502 and projecting away from the frame. A pair of lower connectors 542 is provided for each lift and rotate assembly 504. The lower connectors 542 are positioned to receive and support the lower mounting pins 534 on the respective lift and rotate assembly 504. Each lower connector 542 has a semicylindrical inboard recess 544 adjacent to the frame 502 and a semicylindrical outboard recess 546 spaced away from the frame. The inboard and outboard recesses 544 and 546 are each shaped and sized to receive and retain the spherical end portion 540 of one of the lower mounting pins 544 for supporting the lift and rotate assembly 504 in the selected position relative to the frame 502.

As best in seen in FIG. 14, when the lift and rotate assembly 504 is in the forward, operating position, the spherical end portions 540 of the lower mounting pins 534 are retained in the inboard recesses 544 of the lower connectors 542. In this forward, operating position, the center of mass 545 of the lift and rotate assembly 504 is inboard of the inboard recesses 544, such that gravity biases the lift and rotate assembly 504 toward the forward, operating position. The location of the center of mass 545 is generally illustrated in FIG. 14, although the precise location of the center of mass is dependent upon the lift and rotate assembly used in various embodiments for the processing tool.

The lower connectors 542 are adjustable so the position of the lower connectors related to the frame 502 can be adjusted to retain the respective lift and rotate assembly 504 in a selected position and orientation when in the forward, operating position. The upper mounting pins 532 are positioned to engage an adjustable upper leveling component 548 mounted to the frame 502 above the lower connectors 542. Each upper leveling component 548 includes a flat engagement surface 550 positioned to receive the spherical end portion 540 of the upper mounting pins 532. The flat engagement surface 550 allows the respective upper mounting pin 532 to register thereon so the lift and rotate assembly 504 is supported in the selected position for proper positioning relative to the frame 502 and the respective bowl 518. The upper leveling components 548 are adjustable to control the lateral position or angular orientation of the lift and rotate assembly 504 when mounted on the frame 502 and in the forward, operating position. The location of the upper leveling components 548 on the frame's exposed surface allows the components to be easily adjusted from outside of the processing tool to control the position of the process head 516 relative to the bowl or deck.

When the lift and rotate assembly 504 of the illustrated embodiment is to be pivoted from the forward, operating position to the tilted, service position, an operator grasps the body 524 and initially pulls it in the outboard direction away from the frame 502. The lower mounting pins 534 are moved out of the inboard recesses 544 in the lower connectors 542 and into registry with the outboard recesses 546. The body 524 of the lift and rotate assembly 504 is then spaced slightly apart from the frame 502 while still being supported by the lower connectors 542. The lift and rotate assembly 504 is then pivoted about the lower mounting pins 534 to tilt the body 524 of the lift and rotate assembly away from the frame 502 to the tilted, service position. In this tilted, service position, the process head 516 is positioned upward and away from the respective bowl 518 (FIG. 14) so an operator can access the process head from outside of the processing tool 500, for example, for maintenance, service, or repair. When the lift and rotate assembly 504 is in the tilted, service position, an operator can also easily access the bowl or to the deck 522 around the bowl within the processing tool's interior area, for example, to service the bowl, or to change the bowl configuration for a selected processing procedure. Accordingly, the modularity and configuration of the lift and rotate assembly 504 allows for greater and faster interchangeability of the components of the processing tool 500.

When the lift and rotate assembly 504 is tilted outwardly relative to the frame 502 and in the tilted, service position, the assembly's center of mass 545 is outboard of the lower mounting pins 534. Accordingly, gravity assists in retaining the lift and rotate assembly 504 in the tilted, service position relative to the frame 502. A retention lanyard 556 is provided in the illustrated embodiment to prevent the lift and rotate assembly 504 from over-rotating past the tilted, service position. The retention lanyard is securely fixed at one end to the body 524 of the lift and rotate assembly 504 and fixed at the other end to the frame 502. While the illustrated embodiment uses a retention lanyard 556, other embodiments can use other rotational limiting mechanisms to control rotation of the lift and rotation assembly relative to the frame 502.

A latch 558, shown in FIG. 15, is mounted on the body 524 of the lift and rotate assembly 504. The latch 558 has a releasable hook 560 that extends into a latch aperture 560 formed in the frame 502, shown in FIG. 16. The latch 558 is positioned so the hook portion 560 extends into the latch aperture 562 and releasably engages the frame 502 (FIG. 16). The latch 558 helps securely retain the lift and rotate assembly 504 in the forward, operating position with the upper mounting pins 532 in secure engagement with the upper leveling component 548 (FIG. 16). In the illustrated embodiment, the latch 558 is a quarter-turn type latch, although alternate embodiments can use other latching mechanisms, such as a spring or biased latch, to releasably hold the lift and rotate assembly in the forward, operating position.

Figure 17:
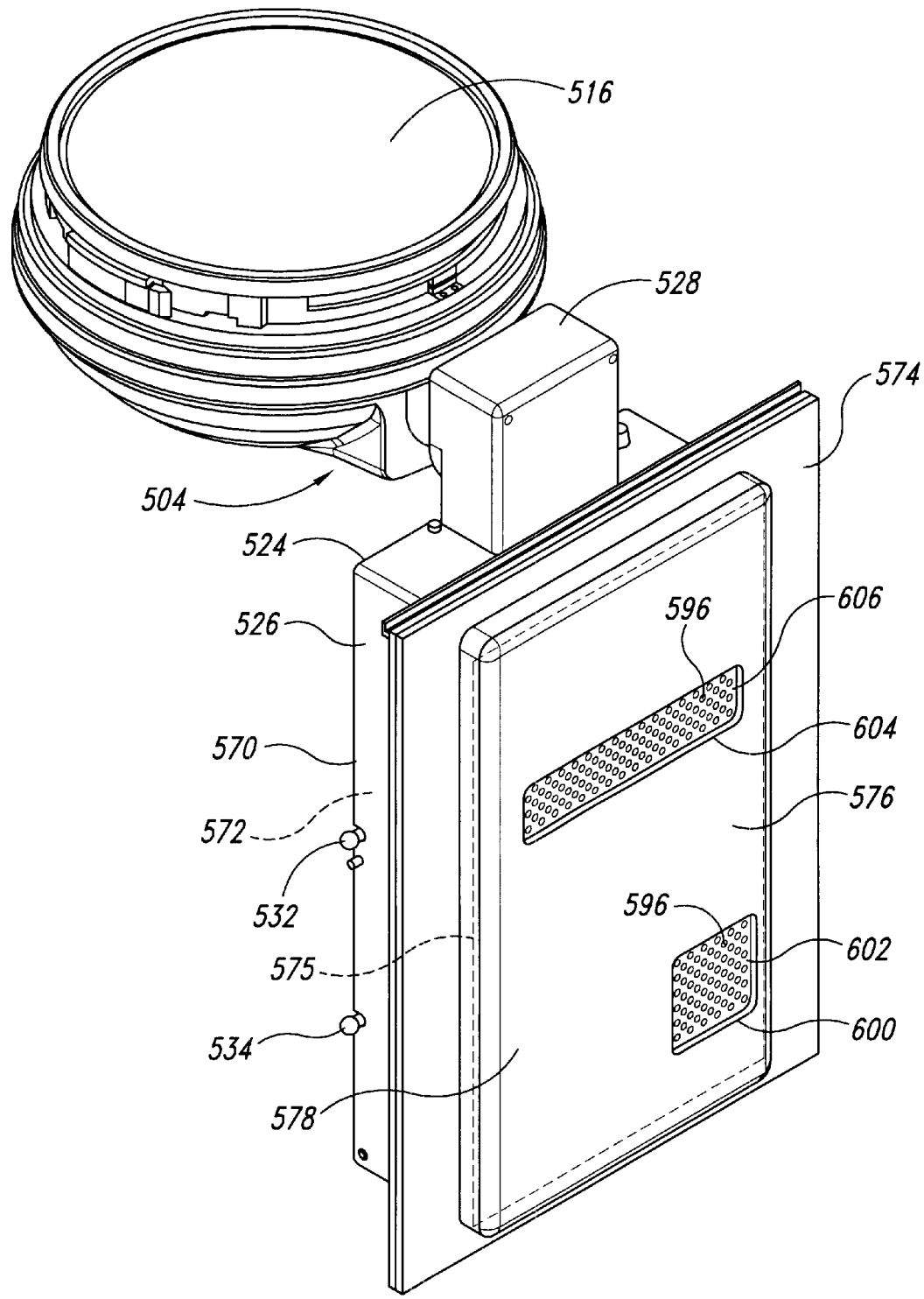
FIG. 17 illustrates an isometric front view of the lift and rotate assembly of FIG. 15.

The lift and rotate assembly 504 of the illustrated embodiment is substantially a fully contained modular assembly that can be easily mounted onto the processing tool's frame 502, or removed from the frame as a unit as shown in FIGS. 15 and 17. The body 524 of the lift and rotate assembly 504 has the first portion 526 that defines a housing 570 with an interior area 572. A close-out bezel 574 is mounted to the front side of the housing 570 and is sized to span between the upper side panels 510 and the lower close-out panel 506 when the lift and rotate assembly is in the forward, operating position, as illustrated in FIG. 12. The closeout bezel 574 has an enlarged opening 575 therein that allows for access into the housing's interior area 572. An access door 578 is mounted to the front of the housing 570 and positioned to cover the opening 575 when the access door is in a closed position, as shown in FIG. 17. In the illustrated embodiment, the access door 578 includes an access cover 576 mounted thereto, as discussed in greater detail below, that combines with the close-out bezel 574 to provide an aesthetically pleasing exterior appearance to the lift and rotate assembly 504 when mounted on the processing tool 500 (FIG. 12).

Figure 18:
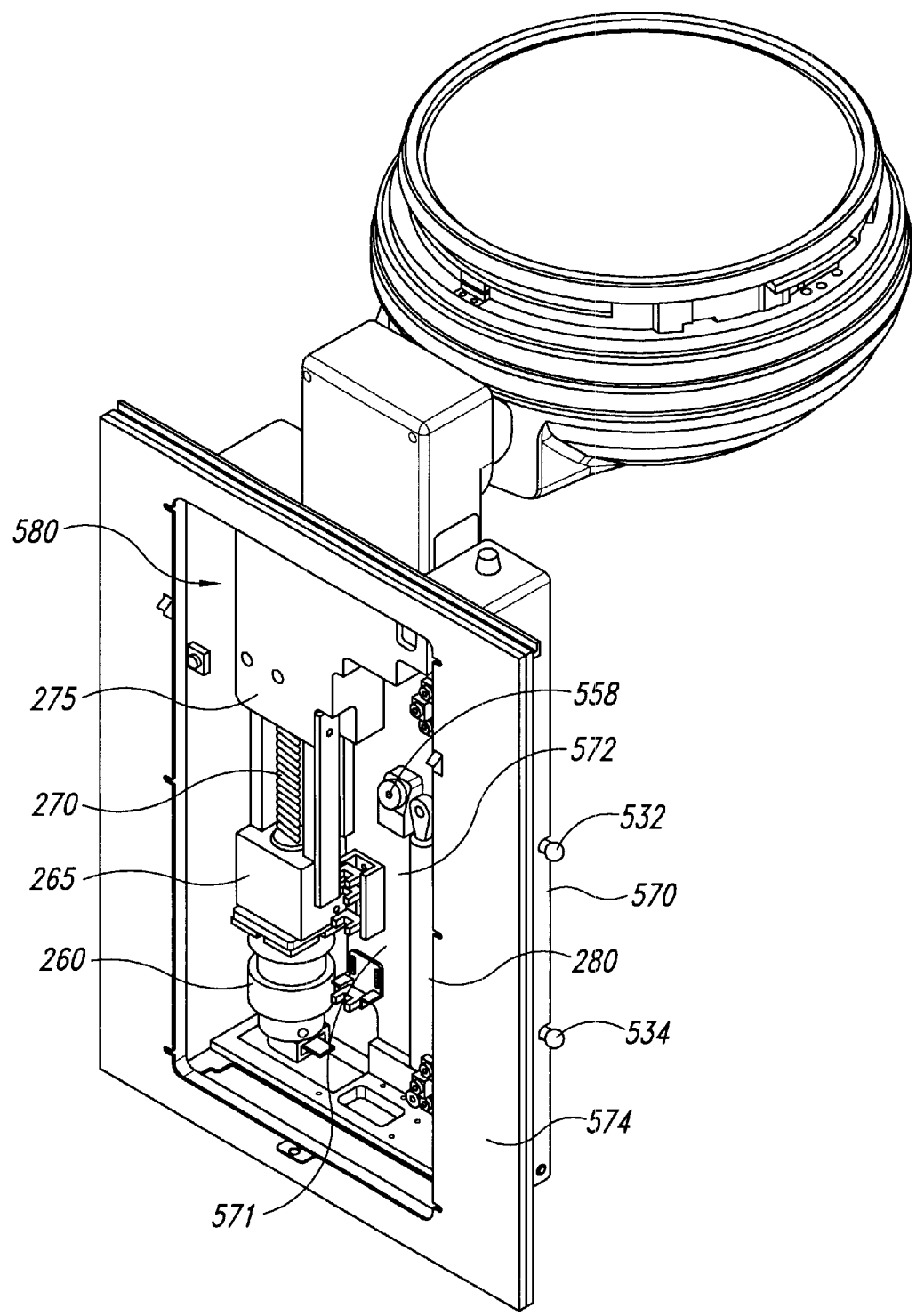
FIG. 18 illustrates an enlarged isometric front view of a lift and rotate assembly of FIG. 12 with an access door removed to illustrate control components.
Figure 19:
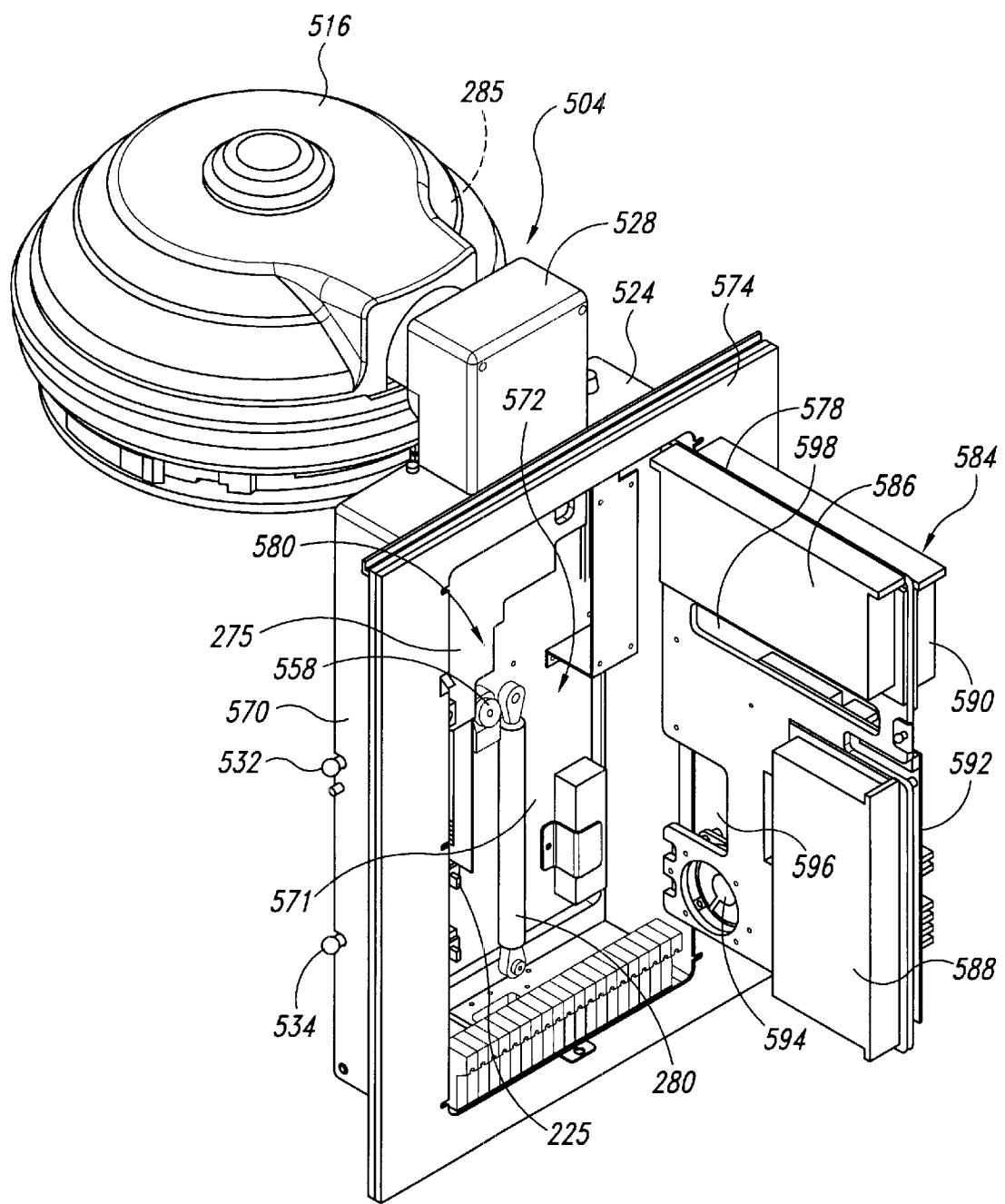
FIG. 19 illustrates an enlarged isometric front view of a lift and rotate assembly of FIG. 12 with an access door in an open position.
Figure 20:
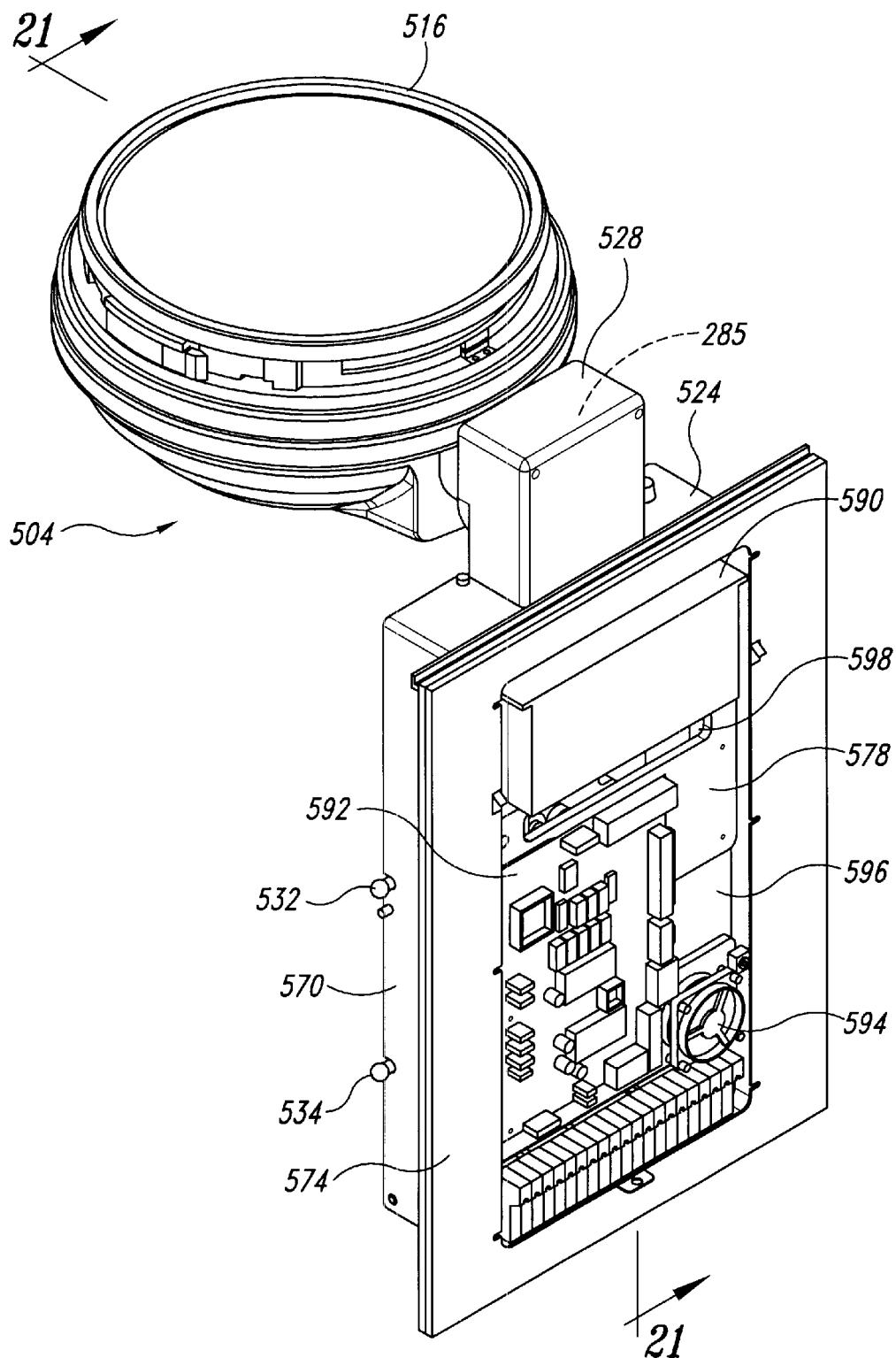
FIG. 20 illustrates an isometric front view of the lift and rotate assembly of FIG. 18 with the access door in a closed position and an access cover removed to illustrate electronic components on the access door.

FIG. 18 is an isometric front view of the lift and rotate assembly 504 with the access door 578 removed to illustrate mechanical components 580 in the interior area 572 of the housing 570. FIG. 19 illustrates an isometric front view of the lift and rotate assembly 504 with the access door 578 in an open position to allow access to the interior area 572. In the illustrated embodiment, the housing 570 contains a plurality of mechanical components 580 in the interior area 572 and mounted to a rear wall 571 of the housing. The mechanical components 580 are configured to control the lift function of the lift and rotate assembly 504. The lift function includes moving the body's second portion 528 between the raised position (as illustrated) and the lowered position (not illustrated).

The mechanical components 580 of the illustrated embodiment include the lift mechanism 225 with the lift access motor 260 and the lift actuator 265 that turns the ball screw 270 (FIG. 18), as discussed above. The guide block 275 is connected to the body's second portion 528 so that rotation of the ball screw 270 causes the guide block 275 to move up and down, thereby moving the body's second portion between the raised and lowered positions. Accordingly, the process head 516 attached to the body's second portion 528 moves with the body's second portion as a unit between the raised and lowered positions. Counterbalance action provided by the compressed gas spring 280 (discussed above) mounted in the housing's interior area 572 facilitates movement of the process head 516 and the body's second portion 528 between the raised and lowered positions. The illustrated embodiments also include the rotate axis assembly 285 located within the body's second portion 528, as discussed above in connection with FIG. 9, for selectively rotating the process head 516 relative to the body 524.

The latch 558, discussed above, is also mounted to the rear wall of the housing 570 and accessed from the front of the housing when the lift and rotate assembly 504 is to be unlatched from the frame and moved to the tilted, service position, an operator opens the access door 578 (FIG. 19) to expose the interior area 572, and turns the latch 558 one-quarter turn to disengage it from the frame 502. The lift and rotate assembly 504 can then be tilted from the forward, operating position to the tilted, service position.

The mechanical components 580 are fully contained within the housing's interior area 572 and provide a compact modular assembly for controlling the lift and rotational movement of the process head 516. The mechanical components 580 in one embodiment are coupled to quick disconnect members to provide power, such as electrical or pneumatic power, to the mechanical components for operation of the lift and rotate assembly 504. In alternate embodiments, hydraulic power can be provided to the mechanical components if needed. The quick disconnect members allow for the fast and easy installation or removal of the lift and rotate assembly 504 to or from the processing tool's frame 502.

As best seen in FIG. 19, the lift and rotate assembly 504 also includes an electronics module 584 mounted on the access door 578 and configured to control and monitor operation of the lift and rotate assembly 504. The electronics module 584 includes a rotate amplifier 586 and a spin amplifier 588 mounted on the inside surface of the access door 578. The electronics module 584 also includes a lift amplifier 590 and a lift/rotate control board 592 mounted on the outside of the access door 578. The lift/rotate control board 592, the lift amplifier 590, the spin amplifier 588, and the rotate amplifier 586 are all modular components that can each be removed and replaced with a new component, thereby allowing for fast and efficient servicing or repair of the electronics module 584. Such efficient repair or servicing helps reduce the amount of downtime of the lift and rotate assembly.

In the illustrated embodiment, a cooling fan 594 is also mounted in an aperture formed in the bottom portion of the access door 578 adjacent to the lift/rotate control board 592. The access door 578 also has an air inlet aperture 596 located above the electronics cooling fan 594 and an elongated air outlet aperture 598 below the lift amplifier 590 and the rotate amplifier 586. The air inlet aperture 596 allows the cooling fan 594 to draw air into the housing's interior area 572 to cool the electronics on the inside of the access door 578. The airflow in the interior area 572 also cools the mechanical components 580 contained within the housing 570 to the extent needed. The air outlet aperture 598 allows the cooling air to flow out of the housing's interior area 572 when the access door 578 is closed to maintain good airflow through the housing 570 and over the electrical and mechanical components.

Figure 21:
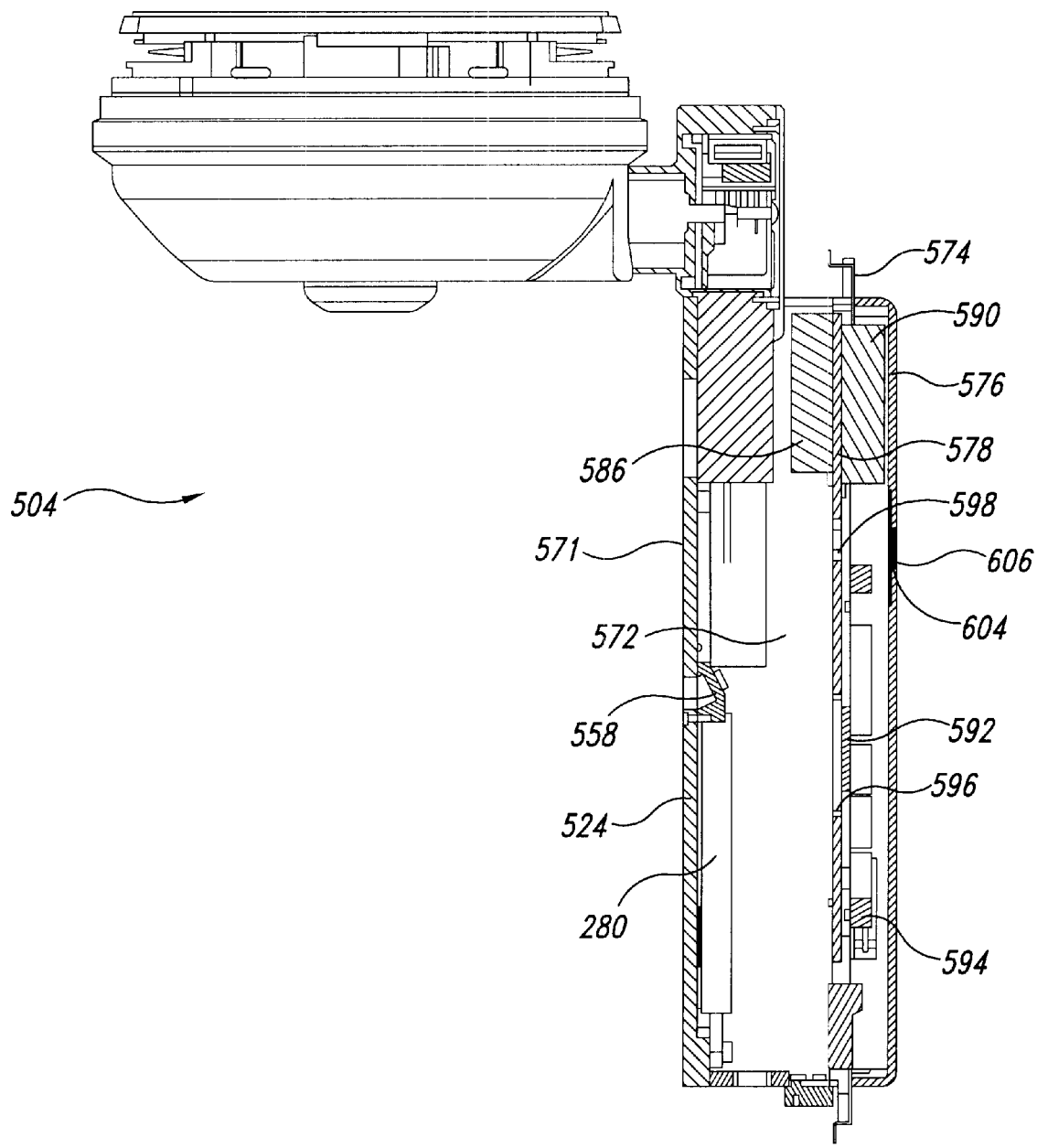
FIG. 21 illustrates a cross-sectional view taken substantially along line 21—21 of FIG. 20 with the access cover on the access door.

As indicated above and shown in FIGS. 17 and 21, the access door 578 includes the access cover 576 removably mounted onto the outside of the access door covering the lift amplifier 590, the lift/rotate control board 592, the cooling fan 594, and other components that may be mounted to the outside of the door. The access cover 576 includes an air inlet aperture 600 (FIG. 17) with a flow screen 602 positioned adjacent to the air inlet aperture 596 in the access door. The access cover 576 also has an air outlet aperture 604 with a flow screen 606 positioned adjacent to the air outlet aperture 598 in the access door. The air inlet and outlet apertures 600 and 604 in the access cover allow the cooling airflow to enter and exit the housing's interior area 572, and also to flow over the components mounted to the outside of the access door. The airflow pattern in alternate embodiments can be controlled or changed by using different access covers 576 having inlet or outlet apertures of different sizes or locations as needed for the configuration of the modules on the access door or in the housing's interior area.

In operation, the lift and rotate assembly 504 is mounted onto the frame 502 of the processing tool 500. When the lift and rotate assembly 504 is in the forward, operating position, an operator can easily access the electronics module 584 on the access door 578 from the exterior of the processing tool 500. Similarly, the operator can access the mechanical components 580 of the lift and rotate assembly 504 simply by opening the access door 578 either when the lift and rotate assembly is in the forward, operating position or in the tilted, service position. Accordingly, the operator does not need to access the interior area of the processing tool 500 in order to service or repair the mechanical or electrical components for an individual lift and rotate assembly. In the event that service or repair for a lift and rotate assembly 504 is sufficiently extensive or time-consuming, the entire lift and rotate assembly can be removed and replaced with a new lift and rotate assembly, thereby greatly reducing the downtime of processing tool 500.

The mounting of the lift and rotate assemblies 504 on the front edge or exposed portion of the frame 502 provides significant benefits for the processing tool 500. In addition to the easy and direct accessibility of the lift and rotate assembly 504 from the outside of the processing tool 500, the lift and rotate assembly is also easily movable to the tilted, service position for direct access to the interior of the processing tool. Mounting of the lift and rotate assembly 504 on the forward edge of the frame 502 also allows a smaller deck 522 to be used in the processing tool 500 for reducing the tool's footprint. This smaller footprint translates into very valuable space savings within a clean room that typically contains a semiconductor wafer-processing tool. Alternatively, larger process heads 516 and bowls 518 can be used for a 300 mm wafer or other larger workpiece without having to enlarge the size of the processing tool's deck footprint within the clean room.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A lift and rotate assembly for use in a workpiece processing tool having frame with an outer edge portion and a deck connected to the frame, comprising:

a body with first and second portions, the first portion being releasably positionable adjacent to the outer edge portion of the frame, the second portion being connected to the first portion and being movable relative to the first portion between raised and lowered positions;

control components carried by the body and configured to move the second portion of the body between the raised and lowered positions; and a process head rotatably connected to the second portion of the body and being movable with the second portion between the raised and lowered positions relative to the first portion, the process head, the control components, and the body being removable from the outer edge portion of the frame as a unit.

2. The lift and rotate assembly of claim 1 wherein the body has connectors connectable to the frame, and the body is pivotable about the connectors relative to the frame between a forward, operating position with the body's first portion adjacent to the frame, and a tilted, service position with the body's first portion tilted away from the frame.

3. The lift and rotate assembly of claim 1 wherein the control components are contained in the body's first portion.

4. The lift and rotate assembly of claim 1 wherein the control components include a lift mechanism and electronic control circuitry contained in the body's first portion.

5. The lift and rotate assembly of claim 1 wherein the body's first portion includes a housing that contains the control components and an access door connected to the housing, the access door being movable relative to the housing between open and closed positions to provide access to the control components when the body is connected to the frame.

6. The lift and rotate assembly of claim 5 wherein the control components include mechanical components and electrical components, a plurality of the electrical control components are mounted on the access door and are coupled to the mechanical components in the housing.

7. The lift and rotate assembly of claim 1 wherein the control components include a first set of components operably connected to the body's second portion, the body's first portion including a housing that contains the first set of components, an access door connected to the housing and being movable relative to the housing between open and closed positions when the body is connected to the frame, and a second set of components mounted on the access door and operatively coupled to the mechanical lift components, the electrical components being movable with the access door as a unit between the open and closed positions.

8. The lift and rotate assembly of claim 7 wherein the body is pivotable relative to the frame between a forward, operating position with the body's first portion adjacent to the frame, and a tilted, service position with the body's first portion tilted away from the frame.

9. The lift and rotate assembly of claim 1, further comprising a latch connected to the body and positioned to releasably retain the body adjacent to the frame in a forward, operating position.

10. The lift and rotate assembly of claim 1 wherein the body's first portion has connector pins pivotally connectable to the frame, and the body, control components, and process head being pivotable about the connector pins relative to the frame as a unit between a forward, operating position and a tilted, service position.

11. A lift and rotate assembly for use in a workpiece processing tool having a frame with an outer edge portion and a deck connected to the frame, the assembly being connectable to a process head, comprising:
 a body with a first and second portions, the first portion being releasably connectable to the outer edge portion of the frame, the second portion being (a) coupled to the first portion, (b) movable relative to the first portion between raised and lowered positions, and (c) configured to carry the process head; and
 control components carried by the body, wherein the control components move the second portion of the body between the raised and lowered positions, and the control components and the body being removable from the outer edge portion of the frame as a unit.

12. The lift and rotate assembly of claim 11 wherein the body's first portion includes a housing that contains the control components and a closure member connected to the housing, the closure member being movable relative to the housing between open and closed positions when the body is connected to the frame to provide access to the control components.

13. The lift and rotate assembly of claim 12 wherein control components mounted to the body is a first set of control components, and the closure member has a second set of control components mounted thereon, the second set of control components being operatively coupled to the first set of control components.

14. The lift and rotate assembly of claim 11 wherein the control components include mechanical lift components operably connected to the body's second portion, the body's first portion includes a housing that contains the mechanical lift components, a closure member connected to the housing and being movable relative to the housing between open and closed positions when the body is connected to the frame to provide access to the control components, and electrical components mounted on the closure member and coupled to the mechanical lift components, the electrical components being movable with the closure member as a unit between the open and closed positions.

15. The lift and rotate assembly of claim 11 wherein the body is pivotable relative to the frame between a forward, operating position with the body's first portion adjacent to the frame and an outward service position with the body's first portion connected to and spaced away from the frame.

16. The lift and rotate assembly of claim 11 wherein the body has connectors connectable to the frame, and the body is pivotable about the connectors relative to the frame between a forward, operating position with the body's first portion adjacent to the frame and a tilted, service position with the body's first portion tilted away from the frame.

17. The lift and rotate assembly of claim 11 wherein the control components are contained in the body's first portion.

18. The lift and rotate assembly of claim 11, further comprising a latch connected to the body and positioned to releasably retain the body adjacent to the frame in a forward, operating position.

19. A workpiece processing tool for processing semiconductor wafers, comprising:
 a frame with an outer edge portion;
 a deck attached to the frame and extending between interior portions of the frame;
 a processing chamber coupled to the deck; and
 a lift and rotate assembly removably mounted to the frame and spaced apart from the deck, the lift and rotate assembly having a body, control components, and a process head, the body having first and second portions, the first portion being releasably connected to the outer edge portion of the frame, and the second portion being connected to the first portion and being movable relative to the first portion between raised and lowered positions, the control components are connected to the body and configured to move the second portion of the body to move relative to the deck between the raised and lowered positions, and the process head is rotatably carried by the second portion of the body and positionable over the processing chamber, and the process head, the control components, and the body being removable as a unit from the outer edge portion of the frame.

20. The workpiece processing tool of claim 19 wherein the frame has connection brackets mounted on the outer edge portion of the frame, and the body of the lift and rotate assembly has connectors removably connected to the connector brackets, the body being pivotable about the connectors relative to the frame between a forward, operating position with the body's first portion adjacent to the frame's outer edge portion, and a tilted, service position with the body's first portion tilted away from the frame's edge portion.

21. The workpiece processing tool of claim 19 wherein the body of the lift and rotate assembly includes connectors, and the frame has connection brackets that removably engage the connectors when the body of the lift and rotate assembly is immediately adjacent to the outer edge portion of the frame.

22. The workpiece processing tool of claim 21 wherein the connection brackets have a first retention portion that engages the connectors when the body is immediately adjacent to the outer edge portion of the frame portion relative to the frame, and the connection brackets have a second retention portion that pivotally engages the connectors when the body is in a service position spaced away from the frame.

23. The workpiece processing tool of claim 19, further comprising a plurality of closure panels removably attached to the frame adjacent to the lift and rotate assembly.

24. The workpiece processing tool of claim 23 wherein the lift and rotate assembly is accessible from exterior of the workpiece processing tool while the closure panels are attached to the frame.

25. The workpiece processing tool of claim 23 wherein the closure panels include upper and lower closure panels positioned to removably cover the frame to enclose an upper chamber above the deck and a lower chamber below the deck, the closure panels being positioned above and below the lift and rotate assemblies without covering the lift and rotate assembly, the lift and rotate assembly being accessible from exterior of the workpiece processing tool without removing one or more closure panels from the frame.

26. The workpiece processing tool of claim 19 wherein the lift and rotate assembly is tiltable relative to the frame to a service position while the lift and processing tool is connected to the outer edge portion of the frame.

27. The workpiece processing tool of claim 19 wherein the control components are contained in the body's first portion.

28. The workpiece processing tool of claim 19 wherein the control components include a lift mechanism connected to the body's second portion and electronic control circuitry operatively connected to the lift mechanism, the lift mechanism and the electronic control circuitry being contained in the body's first portion.

29. The workpiece processing tool of claim 19 wherein the body's first portion includes a housing that contains the control components and a closure member connected to the housing, the closure member being movable relative to the housing between open and closed positions when the body is connected to the frame to provide access to the control components.

30. The workpiece processing tool of claim 29 wherein the control components are being a first set of control components contained in the housing, and the closure member is an access door, and a second set of control components is mounted on the access door and is coupled to the first set of control components in the housing.

31. The workpiece processing tool of claim 19 wherein the control components include mechanical lift components operably connected to the body's second portion, and the body's first portion includes a housing that contains the mechanical lift components, a closure member connected to the housing and being movable relative to the housing between open and closed positions when the body is connected to the frame to provide access to the control components in the housing, and electrical components mounted on the closure member and coupled to the mechanical lift components, the electrical components being movable with the closure panel as a unit between the open and closed positions.

32. The workpiece processing tool of claim 19 wherein the body is pivotable relative to the frame between an operating position with the body's first portion adjacent to the frame, and a tilted, service position with the body's first portion tilted away from the frame.

33. The workpiece processing tool of claim 19, further comprising a latch connected to the body and positioned to releasably retain the body adjacent to the frame's outer edge portion in an operating position.

34. The workpiece processing tool of claim 19 wherein the body's first portion has connectors pivotally connectable to the frame, and the body, control components, and process head being pivotable as a unit about the connectors relative to the frame between a forward, operating position and a tilted, service position.

35. The workpiece processing tool of claim 34 wherein the lift and rotate assembly is pivotal about the connection point to a tilted, service position relative to the frame, the center of mass of the lift and rotate assembly being outboard of the connection point relative to the frame when the lift and rotate assembly is in the tilted, service position.

36. A workpiece processing tool, comprising:
a frame with an outer edge portion;
a deck attached to the frame; and
a modular lift and rotate assembly removably mounted to the frame, the lift and rotate assembly having a body, control components, and a process head, the body being releasably connected to the outer edge portion of the frame at a connection point and being positioned in a forward, operating position, the process head being connected to the body and positionable over the deck and movable relative to the deck between raised and lowered positions, the lift and rotate assembly having a center of mass positioned inboard of the connection point, the lift and rotate assembly being biased by gravity toward the forward, operating position.

37. A method of servicing a lift and rotate assembly of a workpiece processing tool, the workpiece processing tool having a frame and a lift and rotate assembly mounted to the frame, the lift and rotate assembly having a body with a first portion attached to the frame and a second portion movably connected to the first portion and being movable between raised and lowered positions relative to the first portion, and a process head is rotatably connected to the body's second portion, comprising:
moving the body's second portion and the process head as a unit to the raised position;
engaging the body of the lift and rotate assembly from a position exterior of the frame;
tilting the body and the process head as a unit relative to the frame from an operating position to a tilted, service position; and
servicing the lift and rotate assembly while the lift and rotate assembly is connected to the frame and in the tilted, service position.

38. The method of claim 37, further comprising removing the lift and rotate assembly and the process head from the frame as a unit from the exterior of the frame without accessing the interior area of the frame.

39. The method of claim 37, further comprising releasing a retention latch between the lift and rotate assembly and the frame before tilting the body and process head as a unit to the tilted, service position.

40. A method of servicing a lift and rotate assembly of a workpiece processing tool, the workpiece processing tool having a frame and a lift and rotate assembly mounted to the frame, the lift and rotate assembly having a body and a process head connected to the body, comprising:
accessing the body of the lift and rotate assembly's body from a position exterior of the frame when lift and rotate assembly is mounted on the frame, the body having housing that contains control components therein, and a closure member mounted on the housing and being movable between open and closed positions;
moving the closure member to the open position to expose the control components while the lift and rotate assembly is mounted on the frame; and
servicing the control components in the housing from exterior of the frame while the lift and rotate assembly is connected to the frame.

41. The method of claim 40, further comprising servicing control components mounted on the closure member.

42. The method of claim 40, further comprising removing the closure panel with the control components thereon from the housing and installing a second closure member with second control components thereon on the housing.

* * * * *